United States Patent
Mann et al.

(10) Patent No.: US 7,873,329 B2
(45) Date of Patent: Jan. 18, 2011

(54) TRANSCEIVER HAVING MIXER/FILTER WITHIN RECEIVING/TRANSMITTING CAVITY

(75) Inventors: Christopher M. Mann, Cornwall (GB); David John Coombs, Oxfordshire (GB)

(73) Assignee: ThruVision Systems Limited, Abingdon, Oxfordshire (GB)

( * ) Notice: Subject to any disclaimer, the term of this patent is extended or adjusted under 35 U.S.C. 154(b) by 745 days.

(21) Appl. No.: 11/553,448

(22) Filed: Oct. 26, 2006

(65) Prior Publication Data

US 2007/0249292 A1    Oct. 25, 2007

Related U.S. Application Data

(60) Provisional application No. 60/794,732, filed on Apr. 25, 2006.

(51) Int. Cl.
*H04B 1/38* (2006.01)

(52) U.S. Cl. .......................... 455/73; 333/102; 333/104; 333/115; 385/8; 385/9; 455/552.1; 455/553.1

(58) Field of Classification Search ............... 455/73, 455/552.1, 553.1; 385/8, 9; 333/102, 103, 333/115
See application file for complete search history.

(56) References Cited

U.S. PATENT DOCUMENTS

| | | | | |
|---|---|---|---|---|
| 4,229,828 A * | 10/1980 | Baird et al. | ................. | 455/326 |
| 4,406,020 A | 9/1983 | Reindel | | |
| 4,418,430 A | 11/1983 | Hulderman | | |
| 5,019,829 A * | 5/1991 | Heckman et al. | ...... | 343/700 MS |
| 5,062,149 A | 10/1991 | Hulderman | | |
| 5,294,895 A * | 3/1994 | Feeney et al. | .................. | 331/9 |
| 5,768,449 A * | 6/1998 | Fuse et al. | ..................... | 385/1 |
| 5,799,116 A * | 8/1998 | Yamamoto | ...................... | 385/2 |
| 6,816,030 B2 | 11/2004 | Chang et al. | | |
| 7,164,902 B2 | 1/2007 | Yamada et al. | | |
| 2001/0043127 A1* | 11/2001 | Tanji | .......................... | 333/26 |
| 2003/0095018 A1* | 5/2003 | Holme | ....................... | 333/209 |
| 2004/0085153 A1* | 5/2004 | Fukunaga | ..................... | 333/33 |
| 2005/0082004 A1* | 4/2005 | Kasai | .................... | 156/345.41 |

(Continued)

FOREIGN PATENT DOCUMENTS

GB        761762 A     11/1956

(Continued)

OTHER PUBLICATIONS

PCT International Search Report for International Application No. PCT/GB2007/001492 dated Apr. 24, 2007, 3 pages.

(Continued)

*Primary Examiner*—Matthew D Anderson
*Assistant Examiner*—Erica Fleming-Hall
(74) *Attorney, Agent, or Firm*—Nixon & Vanderhye PC

(57) ABSTRACT

A transceiver capable of processing signals having wavelengths of less than 1 millimeter and/or more than 1 millimeter comprising a mixer/filter circuit coupled to an IF filter where said mixer/filter circuit is positioned within a mixer block to receive incoming signals guided into one or more feed horn openings of the mixer block by an optical arrangement. The IF filter is also disposed within the mixer block, but is positioned substantially orthogonal with respect to the mixer/filter circuit for efficient use of space.

21 Claims, 24 Drawing Sheets

U.S. PATENT DOCUMENTS

2007/0040735 A1* 2/2007 Matsuo et al. .............. 342/175
2009/0115676 A1 5/2009 Mann et al.

FOREIGN PATENT DOCUMENTS

| JP | 09018363 A | 1/1997 |
|---|---|---|
| WO | 97/30488 A2 | 8/1997 |
| WO | 2004/038854 A2 | 5/2004 |
| WO | 2005/038975 A1 | 4/2005 |
| WO | 2007/125326 A1 | 11/2007 |

OTHER PUBLICATIONS

UK Search Report dated Nov. 29, 2006, re GB 0615140.1.
UK Search Report dated May 15, 2007, re GB 0615140.1.
International Search Report dated Feb. 5, 2008, re PCT/GB2007/001492.
International Search Report dated Aug. 10, 2007, re PCT/GB2007/001523.

* cited by examiner

FUNDAMENTAL $TE_{01}$ MPDE

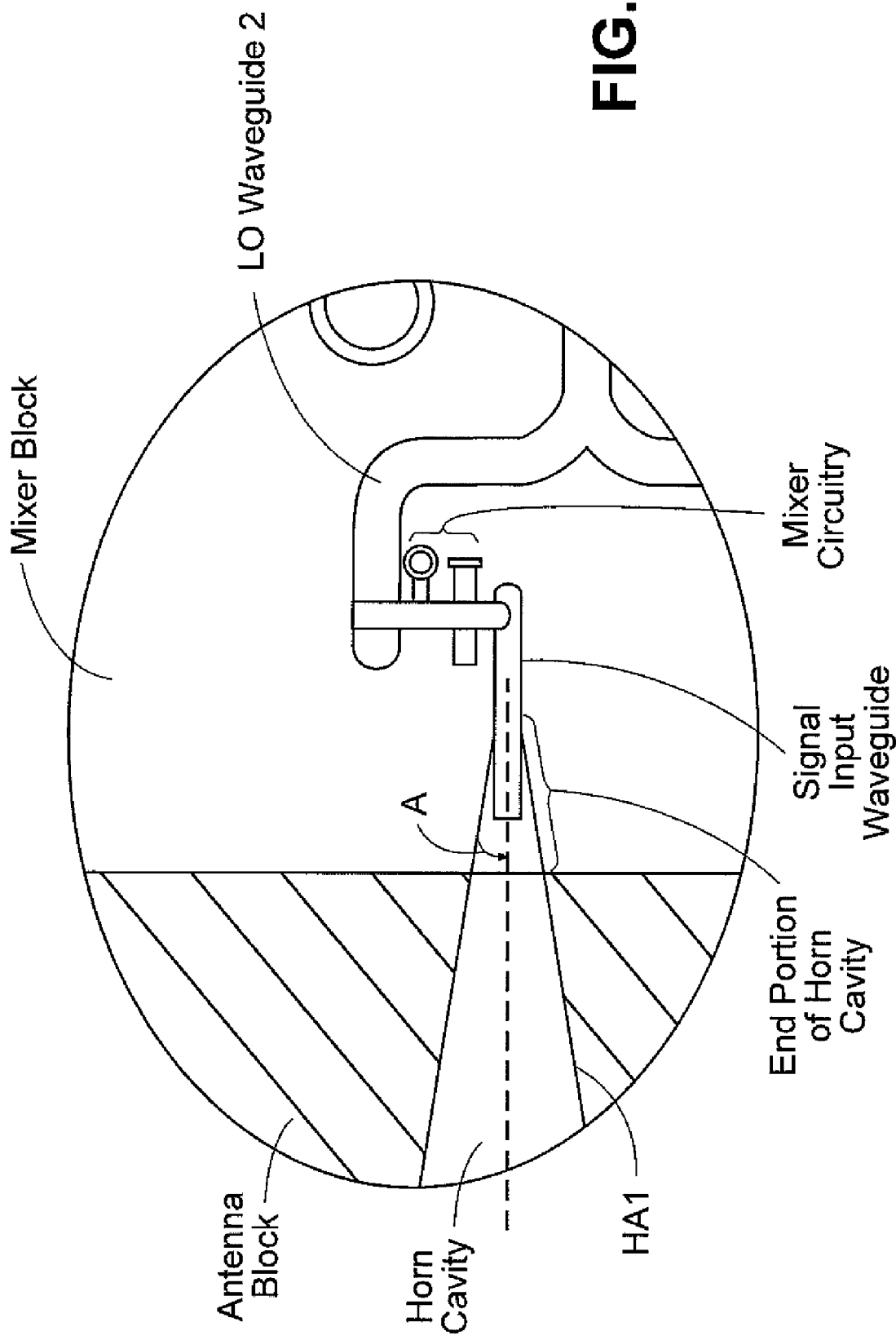

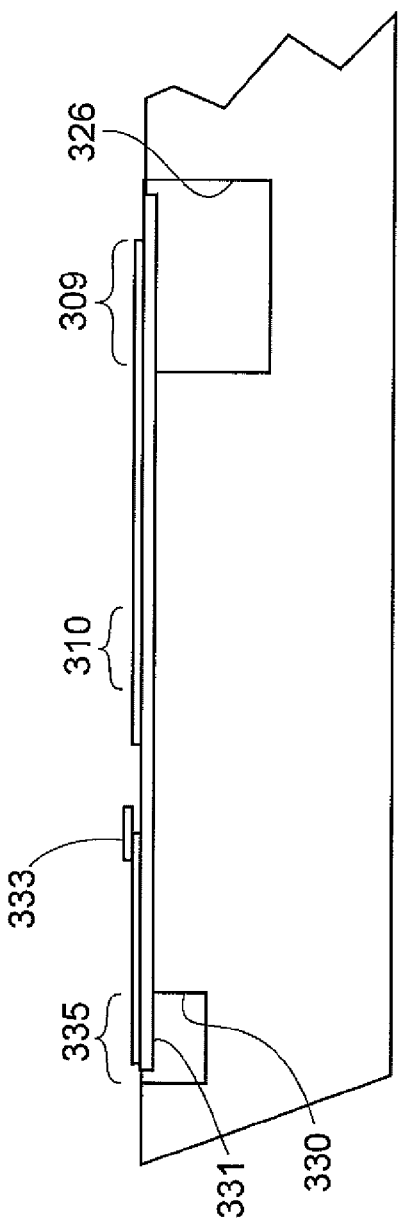
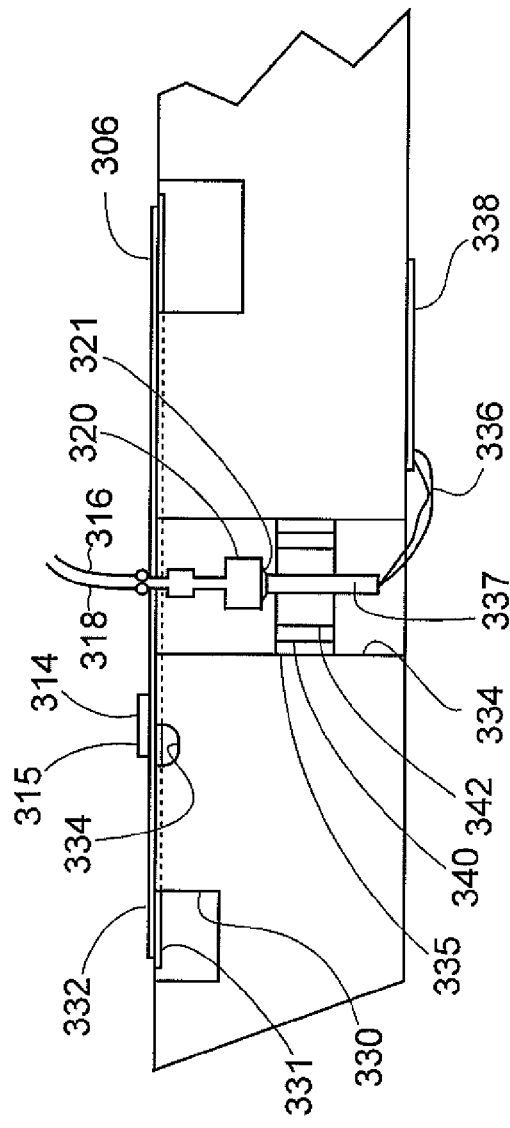

FIG. 3E
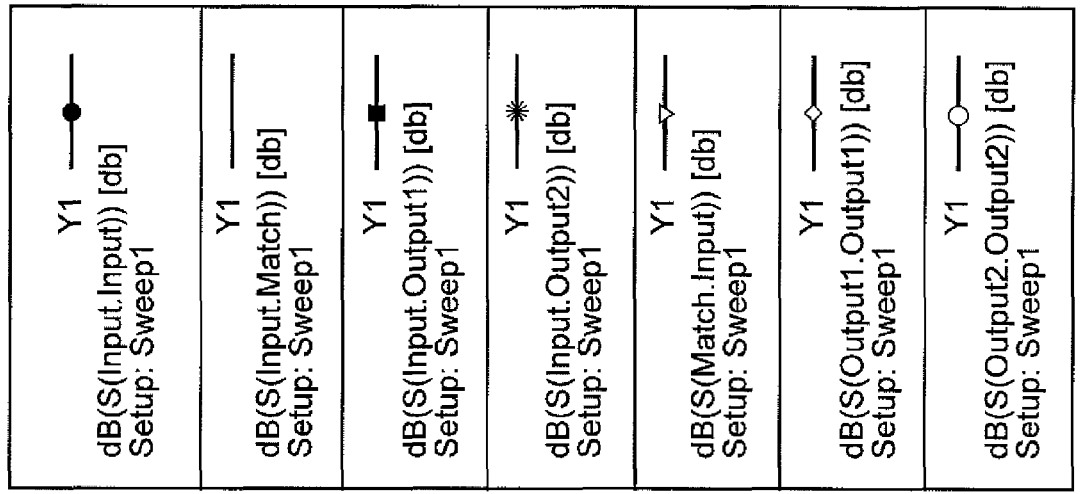
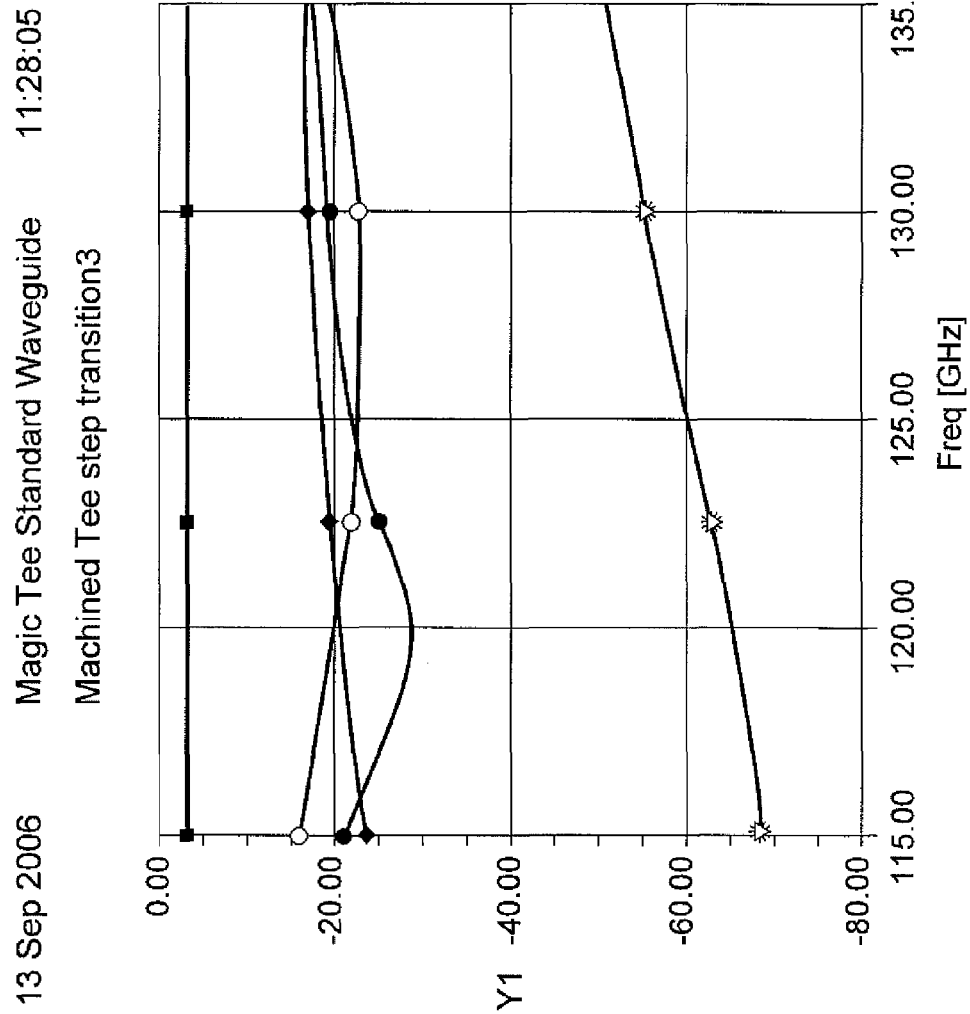

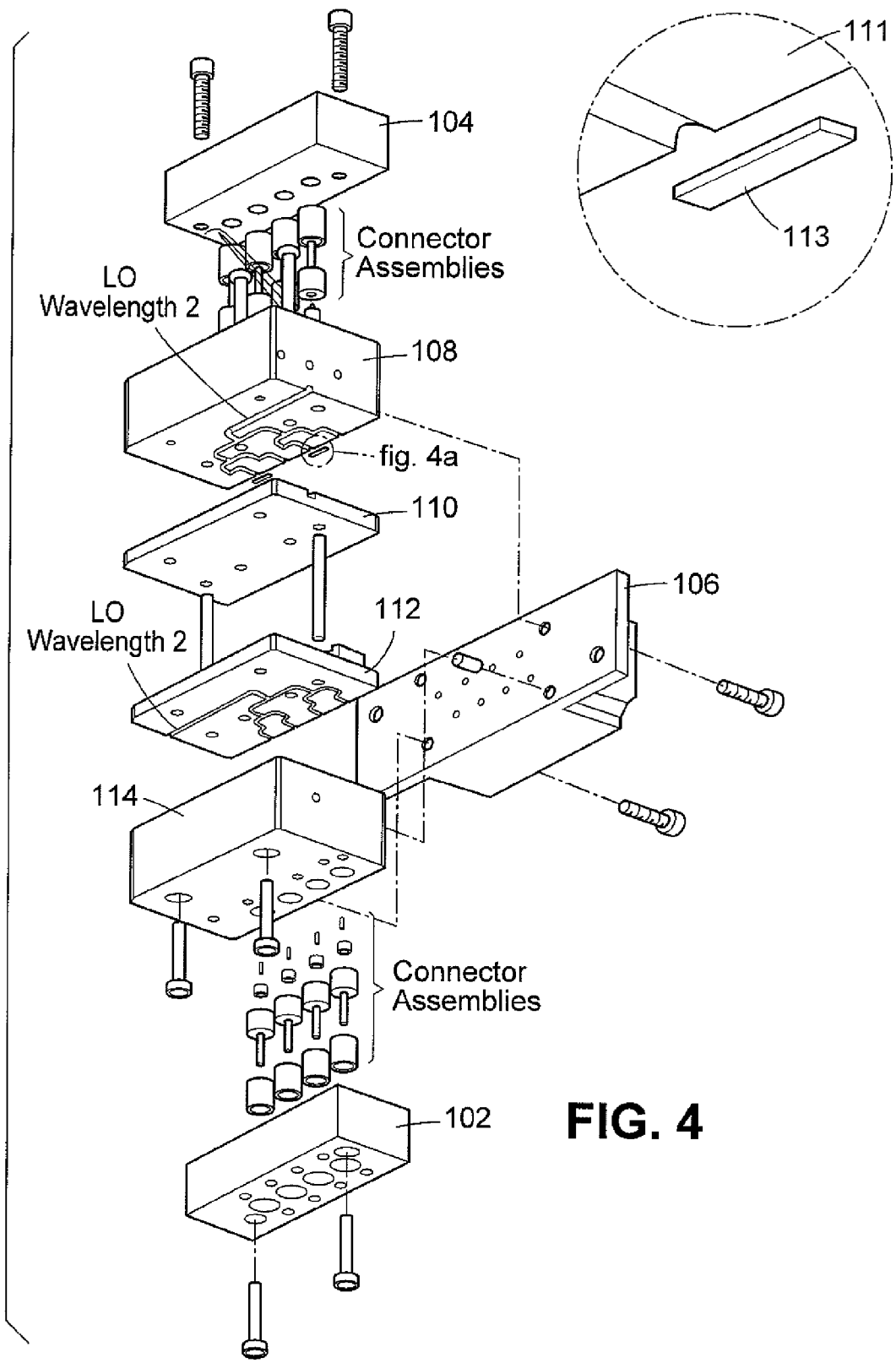

Locate IF pin into recess

TRANSCEIVER HAVING MIXER/FILTER WITHIN RECEIVING/TRANSMITTING CAVITY

This application claims the benefit of the filing date of a provisional application having Ser. No. 60/794,732 which was filed on Apr. 25, 2006.

BACKGROUND OF THE INVENTION

1. Field of the Invention

The present invention relates to a structure and operation for a transceiver device.

2. Description of the Related Art

Electrical and electronic circuitry comprise various types of electrical/electronic components that interact with each other to process signals such as time varying and/or non time varying currents or voltages. The processing of the signals involves the modification of one or more of their characteristics (e.g., signal amplitude, frequency or phase) for a particular purpose. As one or more of the characteristics of the signals change, the physical size and construction of the components needed to process the signals also change; that is, the size of the components used in processing circuitry and the arrangement of the circuitry are directly affected by the range of one or more characteristic of the signals being processed. For example, components such as resistors, capacitors and inductors of a certain size and type are typically used for signals in the High Frequency (HF; i.e., signals approximately in the 3 MHz-30 MHz frequency range) range. However, circuitry which are used to process UHF (Ultra High Frequency) signals have relatively smaller components than those used for HF signals. The physical placement of components with respect to each other, the connection of components to certain other components and the electrical interaction between the components in the UHF circuits have an even more significant effect on the operation of the circuit. Still further, signals having even higher frequency components are processed with even smaller components and often there is no distinction between the components themselves and their interconnections. At microwave frequencies, for example, even the manner in which signals propagate throughout a circuit drastically changes. In many cases, these microwave signals operate as electromagnetic waves propagating through waveguides and are no longer currents and voltages at various points in a circuit; in such microwave circuits, the concept of having distinct components each with a well defined operation becomes blurred. Various conductor structures are seen as distributed components whose operation depend more on their relative positioning with respect to other structures and components in the circuit. The microwave signals have wavelengths in the range of 1 cm to slightly longer than 1 millimeter.

Signals having wavelengths of 1 millimeter or less become extremely difficult to process using conventional circuit techniques. Signals of wavelengths of less than 1 millimeter are sometimes referred to as sub-millimeter signals. It is very difficult to process sub-millimeter signals using components developed for microwave circuitry or components typically used in lower frequency radio waves such as UHF (ultrahigh frequency) and VHF (very high frequency) signals. These sub-millimeter signals are located somewhere above the microwave frequency region of the electromagnetic spectrum and slightly below the infrared portion of the spectrum (i.e., 100 GigaHertz (GHz) to 10 TeraHertz (THz)). Infrared signals are often considered to be optical signals. Because of their relatively short wavelengths and their vicinity to the optical portion of the electromagnetic spectrum, sub-millimeter signals often have characteristics similar to or the same as optical signals. Thus, developing circuit components and circuit structures to process such signals that exhibit both electrical and optical behavior becomes extremely difficult.

SUMMARY

The present invention provides a transceiver having at least two controllable modes of operation where such transceiver is capable of processing signals of different frequency ranges. The transceiver of the present invention is capable of processing sub-millimeter signals as well as signals having wavelengths of one millimeter or more. The transceiver of the present invention comprises a block within which a mixer/filter assembly is disposed. The mixer/filter assembly is coupled to an antenna cavity of the block which antenna cavity is capable of receiving and/or transmitting signals. The mixer/filter assembly is further coupled to a filter circuit and a locally generated signal where said filter circuit is preferably disposed within the block. The first controllable mode is the passive mode where the transceiver of the present invention is able to process signals radiated from objects and/or persons and use said processed signals to generate, for example, certain types of images of these objects and/or persons. In the second controllable mode of operation, i.e., the active mode, the transceiver of the present invention is capable of simultaneously transmitting and receiving signals. A further version of the second mode is that the transmission and reception of signals do not necessarily occur simultaneously. Further, the reception of signals in the second mode of operation can be a passive reception of signals that are not the reflected signals originally transmitted by the transceiver.

In one embodiment, the transceiver of the present invention comprises at least one block having a first cavity for receiving and/or transmitting signals where said first cavity extends into a second cavity of the block; a mixer/filter assembly mounted within the block where at least one portion of said mixer/filter assembly extends into the second cavity and at least another portion of the mixer/filter extends into a third cavity of the block for receiving a locally generated signal and where the first, second and third cavities share a common plane or whose planes are substantially parallel to each other. The transceiver of the present invention further comprises a filter electrically connected to the mixer/filter assembly where said filter is disposed in a fourth cavity of the block where said fourth cavity is substantially perpendicular to the first, second and third cavities.

BRIEF DESCRIPTION OF THE DRAWINGS

FIG. 3 is a magnified portion of FIG. 2E;

FIGS. 3B & 3C show detailed side views of the mixer circuit of FIG. 3A along lines A-A and B-B, respectively;

FIG. 3E shows the performance parameters of the Magic T;

FIG. 4 is an exploded perspective view of the mixer block of the transceiver of the present invention;

FIG. 4A shows the quartz filter circuit;

DETAILED DESCRIPTION

Figure 1:
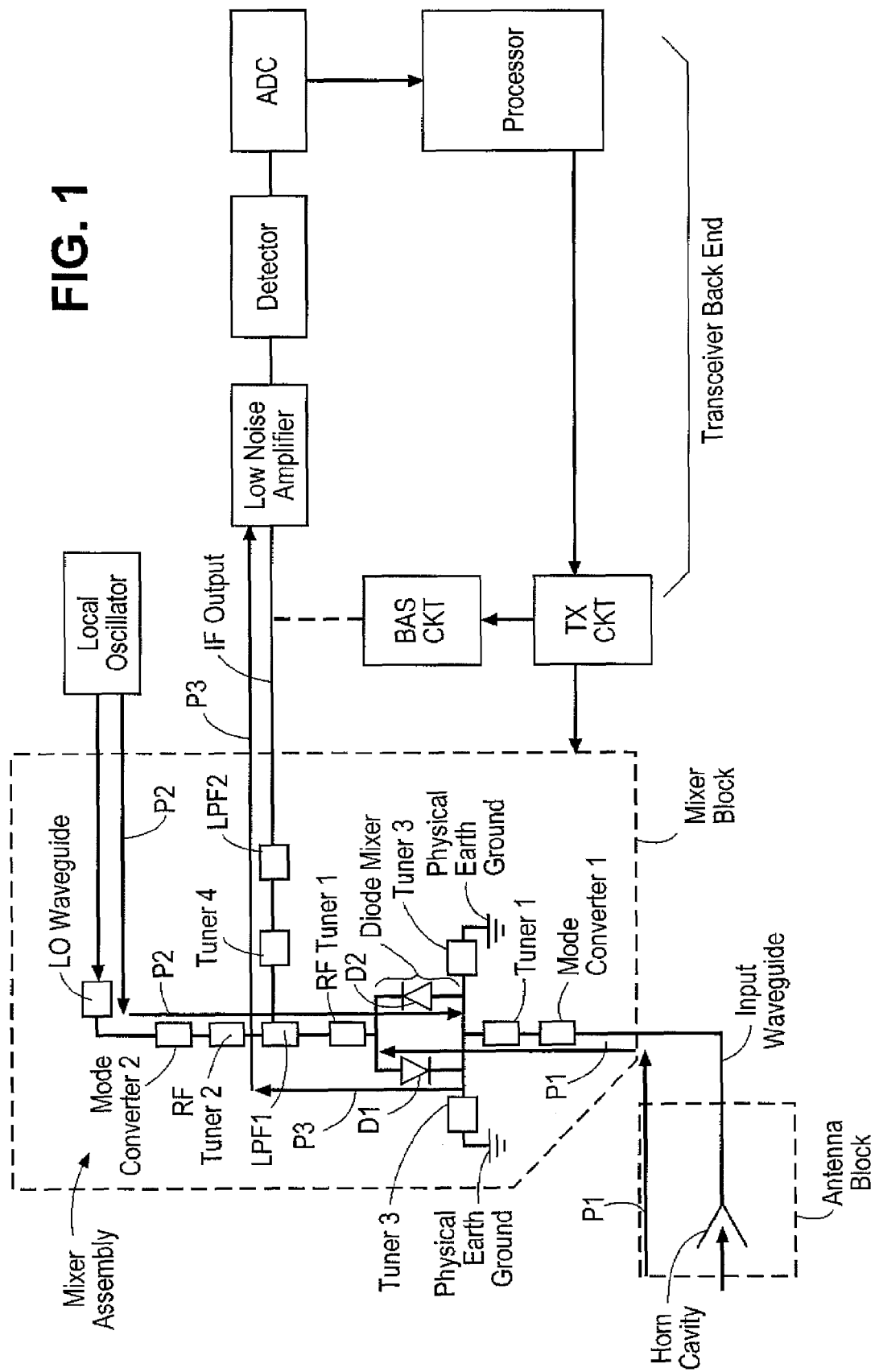
FIG. 1 is a block diagram of the transceiver of the present invention.

The present exemplary embodiment provides a transceiver having at least two controllable modes of operation where such transceiver is capable of processing signals of processing signals of different frequency ranges. Examples of types of processing are: receiving signals, transmitting signals, amplifying signals, mixing one signal with another or mixing one group of signals with another group of signals, filtering signals and detecting signals. The present exemplary embodiment encompasses other types of well known processing techniques of signals such A/D conversion and digital signal processing of signals. In general, processing encompasses the manipulation of signals for one or more purposes. A signal's amplitude, frequency, phase and other characteristic can be manipulated when such a signal is being processed. The transceiver of the present exemplary embodiment is capable of processing sub-millimeter signals as well as processing of signals having wavelengths of one millimeter or more. The transceiver of the present exemplary embodiment comprises a block within which a mixer/filter assembly is disposed. The mixer/filter assembly is coupled to an antenna cavity of the block which antenna cavity is capable of receiving and/or transmitting signals. The mixer/filter assembly is further coupled to a filter circuit and a locally generated signal where said filter circuit is preferably disposed within the block. The coupling of a component to another component is the ability for exchange of signals between the components or the transfer of signals from one component to another. The coupling can be, for example, magnetic, electric, electro-magnetic, optic and electro-optic. In general, coupling encompasses any situation in which a circuit conduit or circuit path is provided to allow one part of a circuit to exchange and/or intermingle its signals with another part of the circuit or with another circuit. The locally generated signal is a signal that is synthesized from other circuitry that is coupled to the transceiver of the present exemplary embodiment or circuitry that is part of the transceiver of the present exemplary embodiment.

The first controllable mode is the passive mode where the transceiver of the present exemplary embodiment is able to process signals radiated from objects and/or persons and use said signals to generate, for example, certain types of images of these objects and/or persons. In the second controllable mode of operation, i.e., the active mode, the transceiver of the present exemplary embodiment is capable of simultaneously transmitting and receiving signals; these received signals can be, for example, from objects and/or persons. A further version of the second mode is that the transmission and reception of signals do not necessarily occur simultaneously. Further, the reception can be a passive reception of signals that are not the reflected signals originally transmitted by the transceiver.

In one embodiment the transceiver of the present exemplary embodiment comprises at least one block having a first cavity for receiving and/or transmitting signals where said first cavity extends into a second cavity of the block; a mixer/filter assembly mounted within the block where at least one portion of said mixer/filter assembly extends into the second cavity and at least another portion of the mixer/filter extends into a third cavity of the block for receiving a locally generated signal and where the first, second and third cavities share a common plane. The transceiver of the present exemplary embodiment further comprises a filter electrically connected to the mixer/filter assembly where said filter is disposed in a fourth cavity of the block where said fourth cavity is substantially perpendicular to the first, second and third cavities. The first, second and third cavities have at least a longitudinal portion that lies in a plane that is parallel to a common plane between the three cavities. The fourth cavity does not have such a longitudinal portion; it has a longitudinal axis that is perpendicular to the common plane.

Referring to FIG. 1, there is shown a block diagram of the transceiver structure and circuitry of the present exemplary embodiment. A signal (i.e., input signal or detected signal) is routed into the opening of the antenna horn (i.e., the first cavity) by any one of various means to be discussed infra. The antenna for the transceiver of the present exemplary embodiment is considered to be at least the conically shaped cavity machined into a metallic block as shown in FIGS. 2A-2E and as will be discussed infra. The antenna of the transceiver of the present exemplary embodiment may also include various structures that are used to guide signals (passive or active) into the conically shaped cavity. The transceiver of the present exemplary embodiment is configured and designed to be able to transmit and/or receive signals having wavelengths of 1 millimeter or less. It should, however, be understood, that the transceiver of the present exemplary embodiment is able to also transmit, receive and process signals having wavelengths of more than 1 millimeter. A received signal is processed by electrical and/or electronic circuitry and electro-optical circuitry all of which form part of the transceiver of the present exemplary embodiment.

The transceiver processes received signals (wavelength of 1 millimeter or less or wavelength of more than 1 millimeter) by performing well known signal processing techniques such as mixing the received signal with a local oscillator signal, filtering the received signal, converting the manner in which the signal propagates and amplifying the signal. The signal is also processed by using additional processing techniques such Analog to Digital Conversion (ADC). The processing performed by the transceiver of the present exemplary embodiment is not to be limited, however, to the particular types of processing mentioned above. Any one or a combination of the mentioned types of signal processing techniques and other well known signal processing techniques form part of the transceiver of the present exemplary embodiment. The transceiver of the present exemplary embodiment has a structure and contains circuitry that are designed to receive various signals (sub-millimeter signals and/or signals with wavelengths of 1 millimeter or more) in either a passive mode where the transceiver only receives signals, and in an active mode where the transceiver is able to transmit and receive signals simultaneously or transmit and receive signals at different times. That is, in the active mode, the transceiver of the present exemplary embodiment can, for example, (1) transmit signals and have such signals reflected by an object and then the transceiver receives and processes these reflected signals; or (2) transmit a first type or group of signals and simultaneously receive and process a second type or group of signals that are not related to the first type or group of signals and are not the reflected signals from the first type or group. The transceiver of the present exemplary embodiment can transmit signals to one object and process signals being radiated by another object and thus the transceiver of the present exemplary embodiment can simultaneously transmit signals and passively receive and process other signals. The passive reception of signals may be due to radiation from moving or stationary objects and/or persons. As such, the transceiver of the present exemplary embodiment can be configured to receive signals whose wavelengths fall within a particular range where all or part of that range includes sub-millimeter wavelengths.

Figure 5:
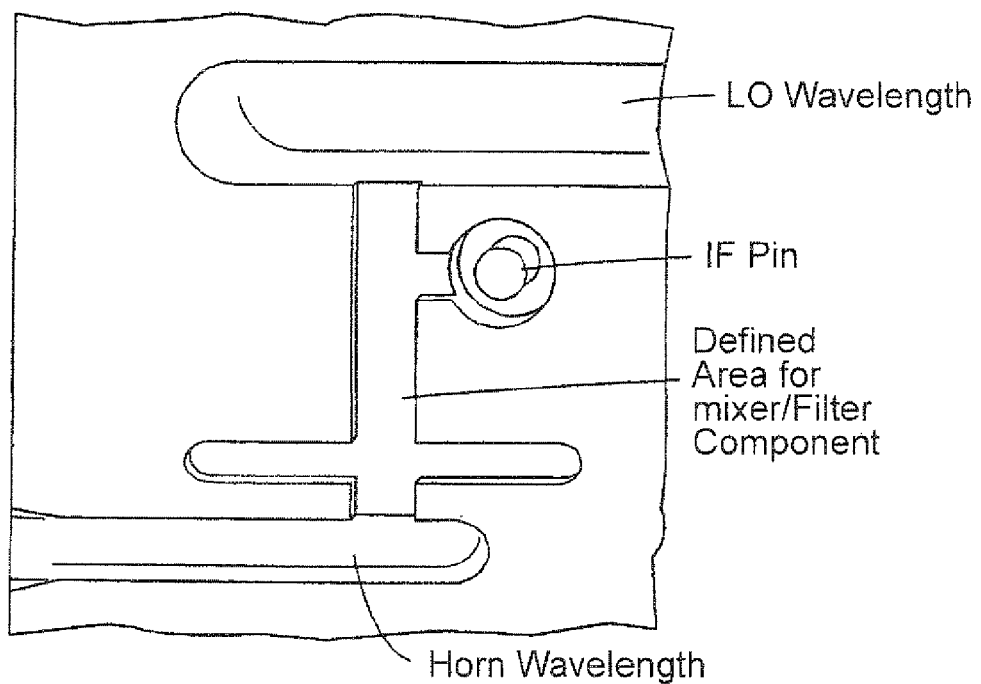
FIG. 5 is a top view of the defined area within the mixer block for the mixer/filter and the waveguides for the received signals and the locally generated signals.

Referring temporarily to FIG. 5, there is shown the particular portion of a mixer block (to be discussed infra.) in which certain grooves or physical channels are machined into the block to define the position of a diode mixer/filter component, and a substantially cylindrical opening of a cavity within which an IF filter pin/Glass bead assembly can be positioned. Portions of the horn waveguide and LO (Local Oscillator) waveguides are also shown; these portions are similarly machined to define the waveguides. The grooves or physical channels and cylindrical openings which are created from the machining of a mixer block are preferably gold plated or plated with a highly conductive metal or alloy. The areas in the vicinity of the machined channels or grooves are also plated. The horn waveguide, the LO waveguide and the cylindrical cavity for the IF filter pin/Glass bead are cavities within the block of the transceiver formed by at least one block or a plurality of blocks as will be shown infra.

Figure 7:
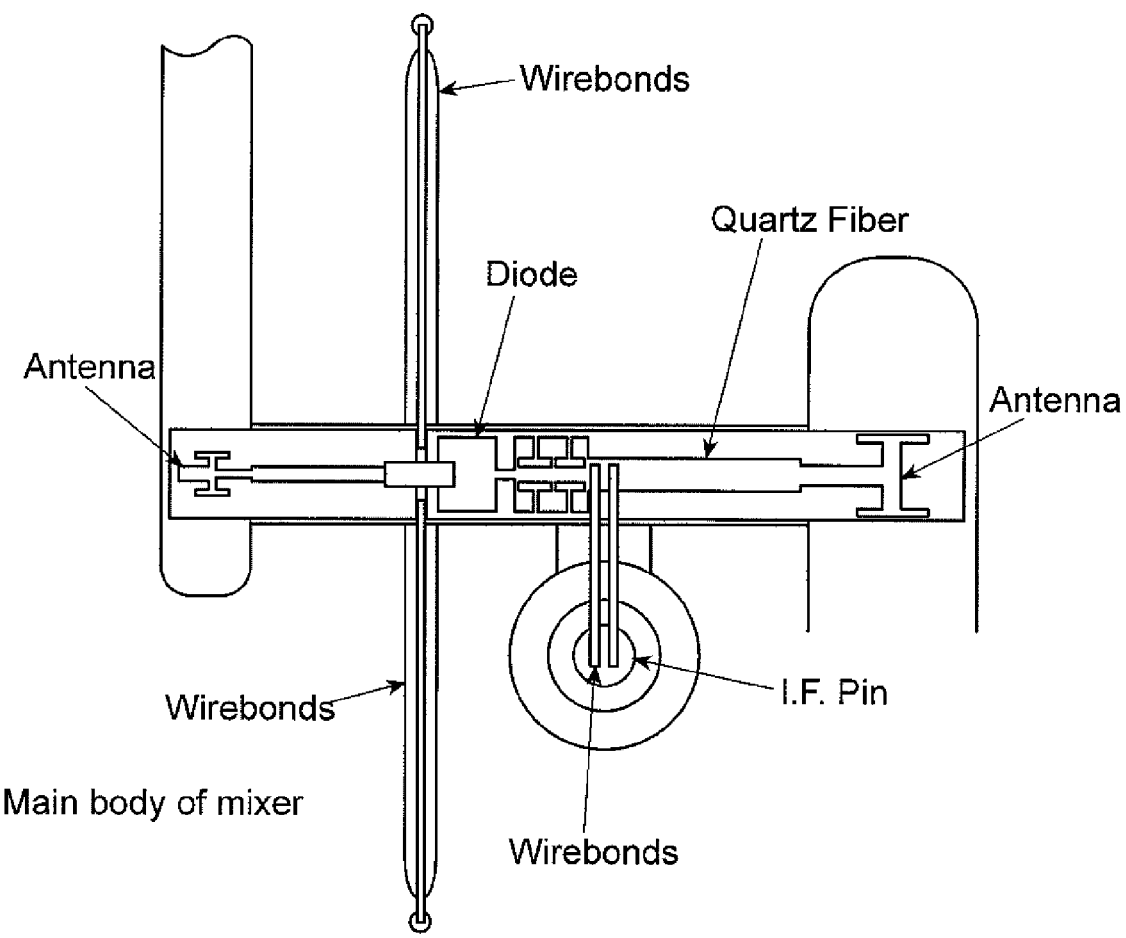
FIG. 7 the filter assembly of FIG. 6 along with a mixer mounted thereon and the various connections of the mixer/filter assembly within the mixer block.

Referring temporarily to FIG. 7, there is shown a diode mixer/filter component mounted in the designated area as discussed above. Also wire bond connections from the diode mixer to various test points and wire bond connections from the filter to the IF pin are shown. At either end of the diode mixer/filter component are antennas which preferably centrally located within the horn waveguide (i.e., second cavity) and LO waveguide (i.e., third cavity) respectively to form mode converters. The mode converter in the horn waveguide converts TEM waves to TE waves or vice versa and the mode converter in the LO waveguide converts TE waves to TEM waves. The filter of the diode mixer/filter assembly is a quartz filter where a metallic pattern is etched on a quartz substrate. The metallic pattern can also be separately manufactured and then adhered to the substrate. A diode, which performs the mixing function, is mounted onto the filter and is electrically connected to the filter. It should be noted that the filter has characteristics that meet the particular requirements of the transceiver of the present exemplary embodiment. Depending on the frequency range within which the transceiver is operating, the filter dimensions, shape and arrangement will differ accordingly. It should also be noted that the mixer components need not necessarily be diodes. Any nonlinear electronic, optic, electro-optic component that can operate in the required frequency range can be used to implement the transceiver of the present exemplary embodiment.

Referring back to FIG. 1, after entering the conical cavity portion of the horn antenna, the signal propagates through a waveguide (i.e., Horn waveguide) and then through a structure called a mode converter (i.e., mode converter 1) which converts the TE (i.e., transverse Electric fields) of the signals to TEM (transverse Electro-Magnetic fields) or converts TEM to TE facilitating the propagation of the signals to various parts of a mixer/filter component while said signals experience relatively little loss or reflection. The diode mixer/filter component, which has physical dimensions preferably on the order of millimeters, comprises Tuners 1, 2, 3 and 4, a diode mixer. Radio Frequency (RF) tuners 1 and 2 and Low Pass Filter 1 (LPF 1) and Low Pass Filter 2 (LPF 2) are implemented with an IF filter pin/Glass bead assembly disposed in a cavity formed within the mixer block assembly to be discussed infra. The mode converters are constructed with filter antennas properly positioned within the waveguides to allow TEM to TE (or TE to TEM) conversion as discussed above. The filter antennas are part of the mixer/filter component. The transceiver of the present exemplary embodiment also has a Local Oscillator (LO) from which an LO signal is generated. The LO signal propagates through a waveguide (i.e., LO waveguide) and is applied to the filter via mode converter 2. The signal from the LO originates from circuitry that are part of the transceiver of the present exemplary embodiment or may be part of a separate circuit. Similarly, and as already discussed above, the signals entering the transceiver via the horn antenna propagate through a waveguide (i.e., horn waveguide) and are applied to the filter via mode converter 1. The two signals are mixed by the diode mixer comprising diodes D1 and D2 resulting in a third or mix signal. This third signal is sometimes referred to as the IF (intermediate frequency) signal.

Referring to FIG. 1, the various routes taken by the three different signals are shown. In all instances the method of fabrication and layout of the circuitry combined with the discrete elements performance are designed to minimize the amount of signal that is lost to resistive attenuation or through poor filter rejection or through excessive mismatch. Circuit lengths are minimized and corresponding insertion losses are kept as low as possible. The signal to be detected is collected from the optics by the horn antenna and transferred to the signal input waveguide. It flows through Mode converter 1 passing along the microstrip circuit length tuner 1 before splitting between tuner 2 and tuner 3 and the RF tuner 1. It is important to note that the mismatch between the mode converter and Tuner 1 is designed to be as small as possible, which then ensures that the length of Tuner 1 has little of no effect on the overall RF signal match to the diodes. This then allows Tuner 1 to be adjusted in order to optimize the LO signal match to the diodes. Tuner 2 and Tuner 3 are transmission lines formed by a gold wire that is ultrasonically bonded between the quartz filter circuit and the mixer block where it makes a physical ground and hence reactive termination reflecting 100% of the RF and LO signal. By varying the width and height of the channel in which Tuner 2 and Tuner 3 reside, the overall match to the diodes can be optimized to a second order. RF tuner 1 consists of a length of microstrip circuit line. It is important to note that the length of RF Tuner 1 has relatively very little effect on the LO signal and can thus be varied to optimize the RF signal match in isolation of the LO signal match. It should be apparent that adjustment of Tuner 1 can provide as favorable as possible LO match in isolation of the RF match and adjustment of RF Tuner 1 provides as favorable as possible RF match in isolation of the LO match. In addition, the lengths of Tuner 2 and Tuner 3 are also empirically fine tuned to couple as much of the incoming RF signal from the horn antenna into the diodes 1 and 2 by providing the correct phase required to compensate for the capacitance of the diodes which can be considerable at the various possible operating frequencies of the transceiver of the present exemplary embodiment. Ideally 100% of the incoming signal would be coupled into the diodes. In a similar manner, the signal from the local oscillator is carried by waveguide to Mode Converter 2 where it is converted into the TEM transmission mode of the quartz filter circuit. The local oscillator signal passes through RF tuner 2 and is rejected by the Low Pass Filter 2 but accepted by Low Pass Filter 1 and carried on to the diodes. The RF tuner 2 and Tuner 4 are formed from line lengths of microstrip circuit and bond wires respectively. Their lengths are empirically selected to simultaneously reduce significantly the effect of the Low Pass Filter 2 on the LO signal and also provide a robust mechanical link onto the quartz filter circuit. The LO signal then propagates along the quartz filter circuit through RF tuner 1 to the diodes. As stated previously RF tuner 1 has little or no effect on the LO signal. At the end of the RF tuner 1 the LO signal splits between tuner 2, tuner 3, and tuner 1. As the RF signal waveguide is in cut-off to the LO signal it provides a purely reactive termination. This acting in conjunction with the reactive terminations at the end of tuner 2 and tuner 3 returns the LO signal back towards the diodes with the correct phase to couple as much LO signal as possible into the diodes. This configuration has been specifically invented to allow significantly accurate coupling of the detected signal and LO signal simultaneously even though they can be separated by a factor of two in frequency. With the input signal and LO signal present in the diodes an intermediate frequency or IF is generated. The diodes D1 and D2 are wired in what is known as an anti-parallel configuration. Because the diodes are anti-parallel mixing is carried out between the detected signal and twice the LO frequency. Other diode configurations can be used to select three times the LO frequency or even higher harmonics. However, generally the higher the harmonic term then the lower the conversion efficiency. The IF signal is much lower in frequency than the RF signal or LO and so tuner 1 tuner 2 and tuner 3 combine to effectively look like a ground slightly behind the diodes. Hence the IF signal propagates along the quartz filter circuit, through RF tuner 1 and Low Pass filter 1. As the IF frequency is substantially below the cut-off frequency of the LO waveguide this acts as a high pass filter and as RF tuner 2 has very short effective electrical length it has no effect on the IF. The IF signal therefore propagates along tuner 4 and is below the cut-off of Low Pass Filter 2 which is formed from a coaxial filter construction method to exit the mixer via a coaxially shielded cable. From here it is taken via conventional coaxial cable into the low noise IF amplifier. That is, the output of the mixer is filtered with the IF filter which has a connector attached thereto. The connector provides electrical connection to a Low Noise Amplifier (LNA) located outside of the mixer block.

One of the most difficult aspects of building successful and reliable circuits when the wavelength of the signal approaches 1 mm in length or below is in providing a robust mechanical connection to the outside world that operates successfully as a high performance circuit element. In this design, use is made of gold bond wires that simultaneously form the mechanical connection between the waveguide cavity and the quartz filter circuit and provide tuning of the Local Oscillator signal and the detected RF signal. In addition, gold bond wires are used to simultaneously form the connection between the quartz filter circuit and the coaxial Low Pass Filter circuit LPF2. The design of the coaxial filter LPF2 fulfils a number of roles. Firstly, its dimensions have been derived to provide a most favorable Local Oscillator rejection available in the space available and in conjunction provide the relatively low insertion loss to the IF signal. In addition, it bridges the dimensional differences between the subminiature quartz circuit that handles the RF signals and the larger dimensions of the coaxial architecture that carries the IF signal. Finally, it provides the means to form a hermetic seal of the various portions of the transceiver block of the present exemplary embodiment.

In the particular embodiment described here the transceiver is designed to detect electromagnetic waves having a wavelength of 1.3 mm to 1.11 mm or from 230 GHz to 270 GHz. In order to achieve a most favorable conversion efficiency from the input signal to the IF signal, a second harmonic mixer can be utilized. Higher order harmonics maybe used at the expense of conversion efficiency but countered by reduced system, complexity. The diodes are configured into an anti-parallel configuration which produces odd order mixing products. The first and hence strongest, odd order down converted mixing product is:

$$2\omega_{LO} \pm 1\omega_{IF}$$

Where $\omega_{LO}$ is the local oscillator frequency and $\omega_{IF}$ is the Intermediate Frequency or IF. The frequency response of the mixer is set primarily by the bandwidth of the mode converter 1. In this embodiment the mode converter provides a better than 15 dB return loss from 220-280 GHz. The secondary bandwidth limitation is the frequency over which the signal is matched to the diode pair. In this embodiment the diode pair are presented with a relatively very accurate match from 220-280 GHz. The third limitation is due to the passband combination of Low Pass Filter 1 and Low Pass Filter 2. In this embodiment the filters provide good transmission from 1-50 GHz and Low Pass Filter 1 has good transmission to 150 GHz before rejecting the RF signal from 190 GHz and upwards. The noise and gain bandwidth of the IF low noise amplifier (LNA) provide a further bandwidth limitation. In this embodiment an amplifier operating from 2-18 GHz is employed. Finally the bandwidth of the detector has been designed to cover the full 2-18 GHz bandwidth of the IF low noise amplifier. The complete mixer circuit has been optimized for operation around 250 GHz at the signal frequency. Consequently the anti-parallel diode pair are driven at a frequency of 125 GHz. Therefore the complete signal bandwidth of the receiver is 232-248 GHz and 252-268 GHz for lower and upper sidebands respectively.

With regard to the filter performances. It is important that Low Pass Filter 1 shown in FIG. 1 provides a relatively great amount of rejection over the entire signal frequency range e.g. 220-280 GHz whilst at the same time providing the relatively low insertion loss to both the IF and the LO. A target of −25 dB for the rejection for the signal and 0.5 dB insertion loss for the LO and IF is a good starting point. In general there is a trade-off in the design of microstrip filters in that for increased rejection bandwidth more sections are required. Whilst increased rejection is desirable there is a trade-off with the resulting increased insertion loss. There is also a space limitation on the allowable physical length. The total separation of the mixers used in this embodiment is 7.2 mm. Previous designs have incorporated the IF Low Pass Filter (Low Pass Filter 2) in line with the first Low Pass Filter on the opposite side of the local oscillator waveguide. However, the overall length of the quartz filter circuit would be longer than the allowable 7.2 mm. Therefore a new and novel approach has been incorporated into this embodiment whereby the IF Low Pass Filter (Low Pass Filter 2) has been kept on the same side of the LO waveguide and has also been rotated orthogonal to the primary assembly plane to utilize the additional space available in that direction. Low Pass Filter 1 and Low Pass Filter 2 have particular characteristics appropriate for the embodiment of the transceiver shown herein.

Still referring to FIG. 1, the output of the LNA is applied to a detector (e.g., a diode detector rectifier and Low Pass Filter) resulting in a detected signal that is converted to a digital signal by the Analog to Digital Converter (ADC). For many applications, the overall signal to noise ratio (SNR) is important. One parameter of the LNA that needs to be controlled and/or monitored to promote acceptable SNR is the ratio of gain variation ΔG to overall gain (G)

$$\left(\text{i.e., } \frac{\Delta G}{G}\right)$$

within a certain defined frequency band of the amplifier. The ADC output is applied to a processor which may comprise a microprocessor and combinatorial and/or sequential digital logic circuits. All or part of the processor can be implemented as a FPGA (Field Programmable Gate Array). A bias circuit, which can be implemented as a bias tee (see FIG. 1B) is applied to the IF output which serves to bias the operating characteristics (i.e., the I-V characteristics-current/voltage characteristics) of the diode mixer (D1 and D2) portion of the mixer/filter component. The biasing of diodes D1 and D2 allows proper mixing of signals by the diodes D1 and D2 resulting in signals that can be transmitted through the horn antenna or signals to be transferred to the LNA for further processing. A transmit circuit (TX CKT) coupled to the bias circuit and/or the mixer and controlled by the processor is designed to modulate and/or encode the transmit signals. Well known modulation and/or coding schemes are used to modify the signal being transmitted. As such, the transceiver of the present exemplary embodiment can be used to simultaneously transmit and receive sub-millimeter wavelength signals or receive (without transmitting any signal) sub-millimeter wavelength signals. In applications, where the transceiver of the present exemplary embodiment is used to only receive signals, the transmit circuit is turned off by the processor. Further, the transceiver of the present exemplary embodiment can be used to receive sub-millimeter signals and transmit signals having wavelengths greater than 1 millimeter simultaneously or at different times.

Figures 1A, 1B:
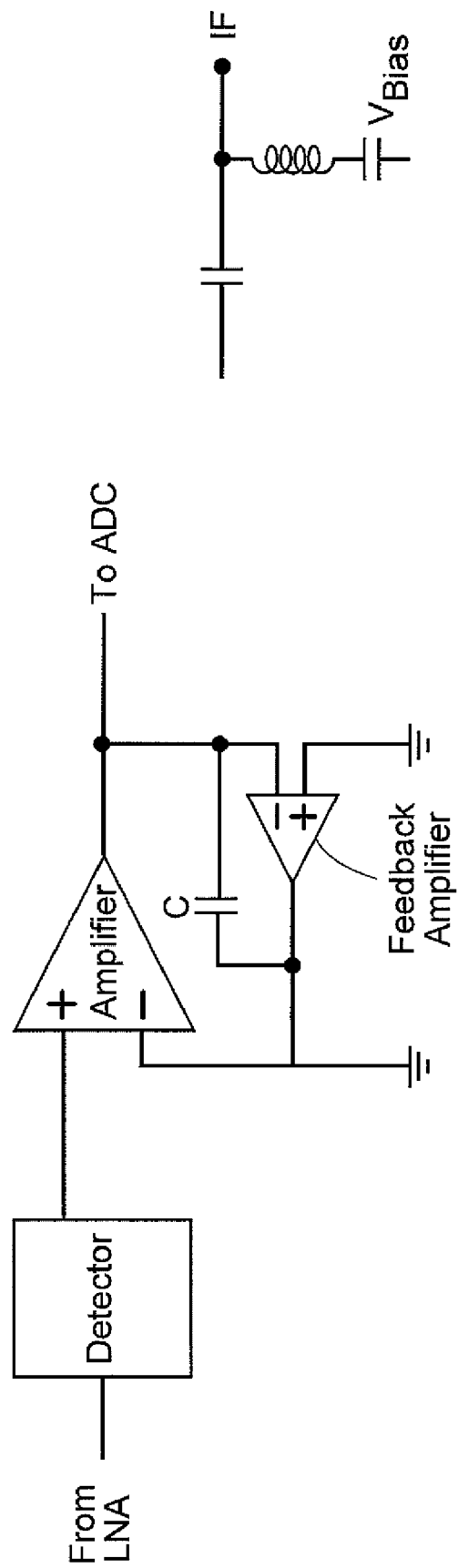
FIG. 1A is a servo-feedback loop and capacitor multiplier circuit used to achieve AC coupling.
FIG. 1B is a bias circuit referred to as a bias T.

One implementation of the detector is to use a diode detector which produces a relatively small signal riding on top of a relatively large DC offset. The signal may be on the order of 10 μV (ten micro volts), whereas the DC level can easily be 600 mV (600 millivolts). A post detection amplifier (not shown in FIG. 1, see FIG. 1A) is AC coupled to the output of the detector to avoid using a high dynamic range acquisition system (e.g., 24 bit ADC). The AC coupling time constant has to be long enough to prevent changes in the DC offset caused by the signal fluctuations, while being short enough to take account of slow thermal drifts; this suggests a time constant which is in the range of 2 seconds to 2 minutes depending on the exact scan speed in certain applications where the transceiver is being used to scan an object or person at a particular scan speed. In practice a 1 minute time constant has been found to be a reasonable compromise. Making an AC time constant of 1 minute without introducing excessive noise and without using an excessively large coupling capacitor is extremely difficult. The AC coupling has, therefore, been achieved using a servo-feedback loop and a capacitor multiplier as shown in FIG. 1A. If the transceiver of the present exemplary embodiment were to use a 12 bit acquisition system to measure a 10 μV signal, this level of performance would require 600 mV/10 μV=60,000 times more levels using a DC coupled scheme, i.e., a 28 bit ADC would be needed. Thus, a relatively high resolution acquisition system is needed even when AC coupling (or its equivalent) is used because it is necessary to run the acquisition system at a relatively low percentage of full scale (e.g., less than 25%) to allow for the inevitable gain and offset drifts of the various amplification stages.

Figure 1D:
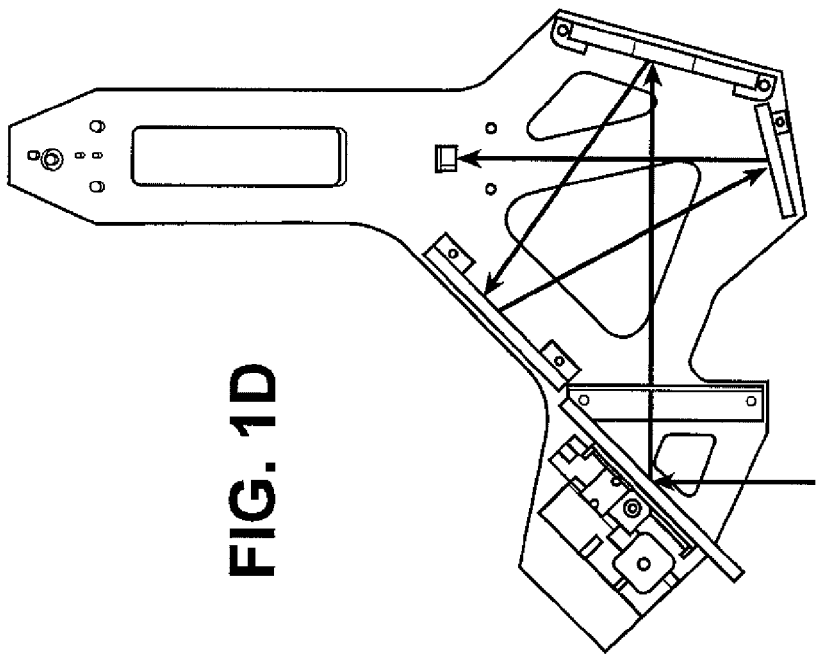
FIGS. 1C & 1D show the optics designed to guide signals into the horn openings of the transceiver of the present invention.
Figure 1C:
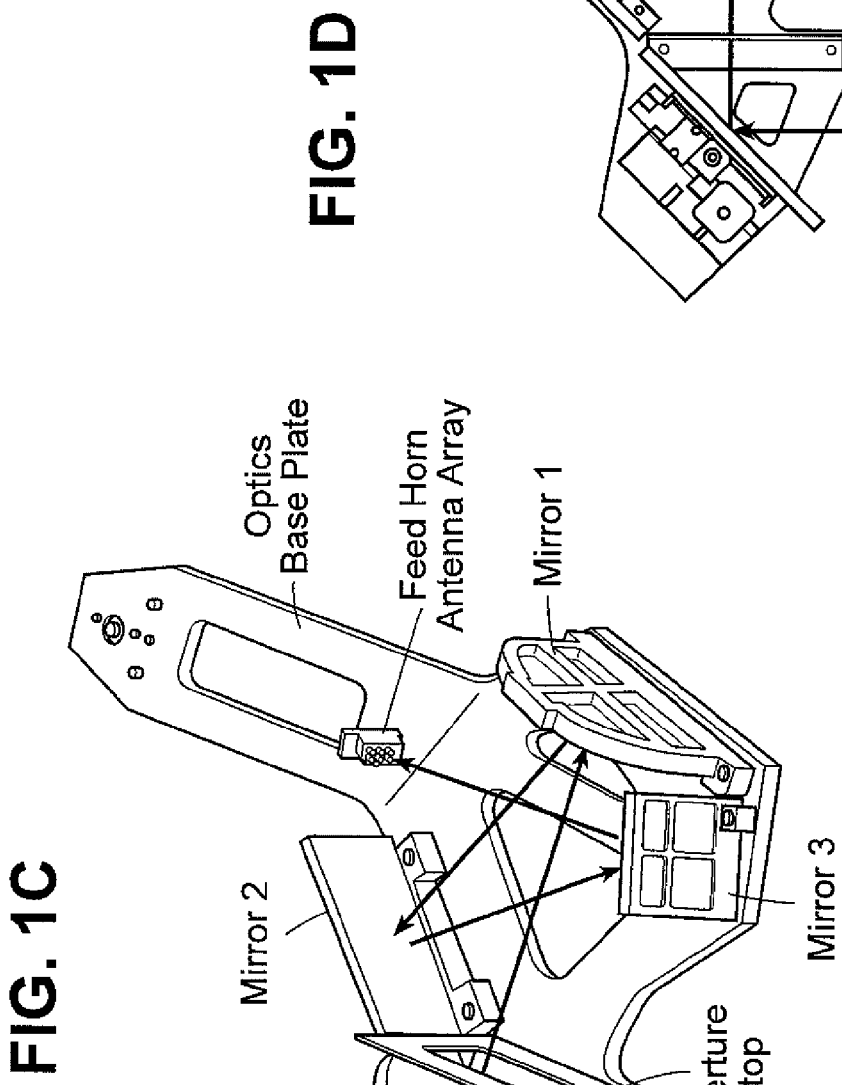

As shown in FIG. 1, the transceiver of the present exemplary embodiment comprises a back end (LNA, detector, ADC, Processor, TX circuit and bias circuit) interfaced to a mixer block assembly and a horn antenna block. The horn antenna block and the mixer block assembly (including the components and waveguides within the mixer blocks) are referred to as the "front end" of the transceiver. The various components of the back and front ends can be interchanged, and further, all or any portion of the back end can become part of the front end. For example, the LO and the LNA can be part of the front end even though they are shown as being part of the back end. It should be noted that each horn is part of an antenna and that the entire antenna comprises a horn and optics (not shown in FIG. 1) used to guide signals into the horn. The transceiver of the present exemplary embodiment includes optics arranged such that the beam waist of the horn matches or is substantially equal to the beam waist of the optics; this promotes significant reduction in signal loss and results in receiving as much of the signal being reflected by the optics as possible. In order to reduce significantly the size of the overall system, the optics utilized in this embodiment consist of a novel rotation type whereby the mirrors are configured in a ring configuration rather than the traditional series configuration. FIGS. 1C & 1D show the optics design and how the optical input rays are converged onto the feed horn antenna array. In addition, a simple but unique scanner mechanism is implemented to provide a fast, reliable scan of the pixel field of view. This scanner utilizes a double rotation axis each independently driven by a simple cam and stepper motor arrangement. This provides very accurate position and pointing without the requirement for encoders. The front end comprising an antenna block having 8 horn antennas and mixer block assembly is shown in FIGS. 2A-2E.

Figure 2A:
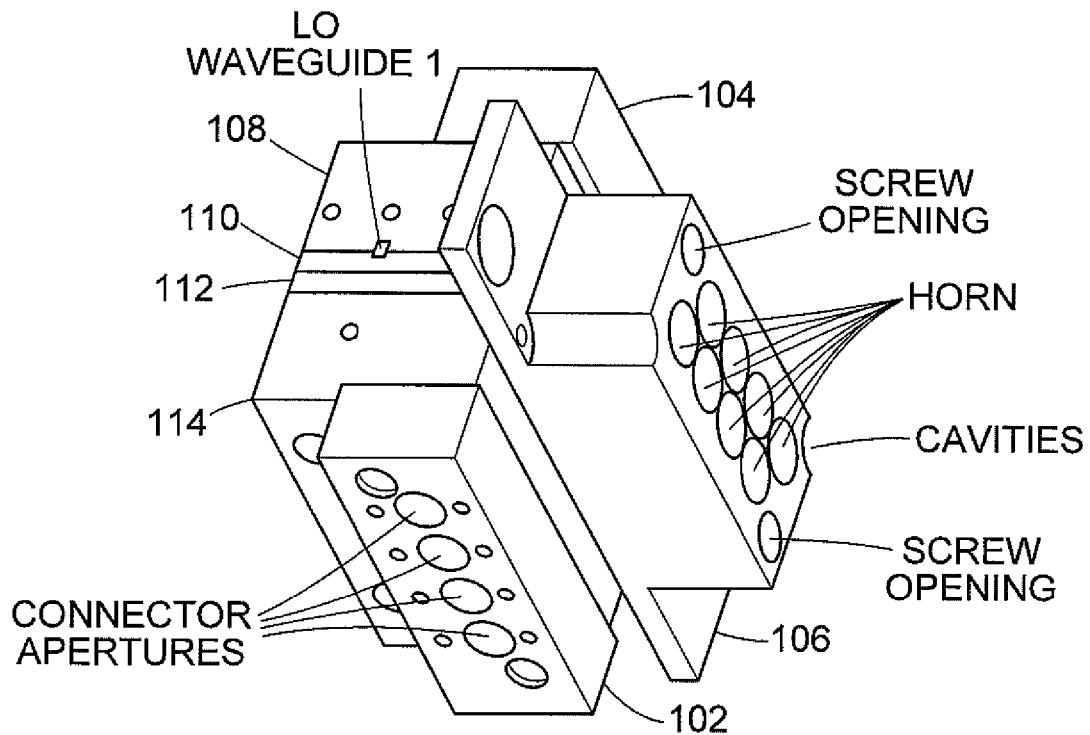
FIG. 2A is a perspective view of the mixer block portion of the transceiver of the present invention.

FIG. 2A shows a perspective view of the front end (horn antenna block and mixer block assembly of the present exemplary embodiment. The horn antenna block and the mixer blocks are preferably made from solid brass material. Other materials such as other metals, metal coated plastic or metal coated semiconductor can also be used. The eight (8) horn antennas are arranged in two 4-antenna rows where each row is displaced with respect to each other. The mixer block assembly comprises blocks 104, 108, 110, 112, 114 and 102 arranged as shown. Blocks 104 and 102 are the top and bottom blocks respectively and contain connector apertures for inserting connectors (such as k connectors) that provide a manner for probing various points of the mixer circuitry once the front end blocks are assembled as shown. There are four connector apertures in block 102 and 4 other apertures (not shown) in block 104. There are various screws and dowel pin openings at the face of the horn antenna block 106 which are used to connect block 106 to the other blocks and also connect block 106 to other structures if necessary.

Figure 2B:
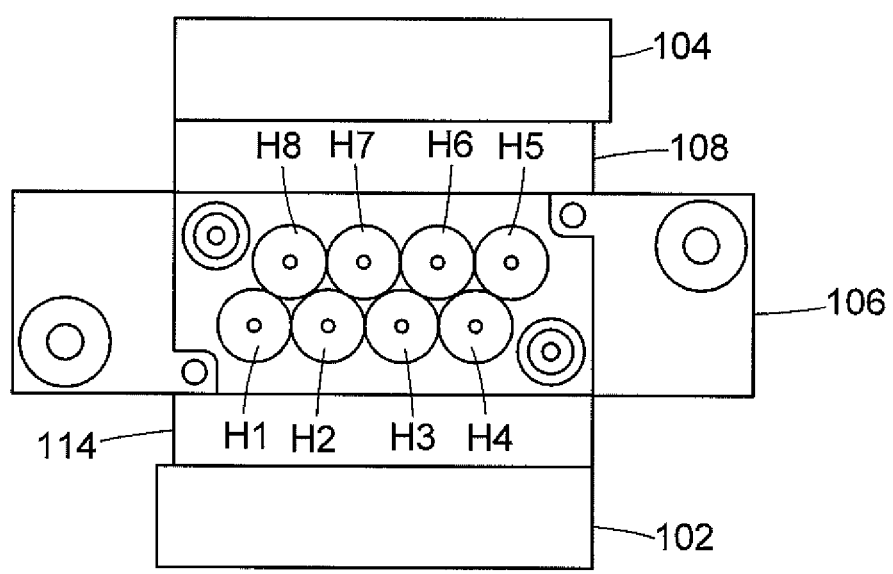
FIG. 2B is a front view of FIG. 2A.
Figure 2C:
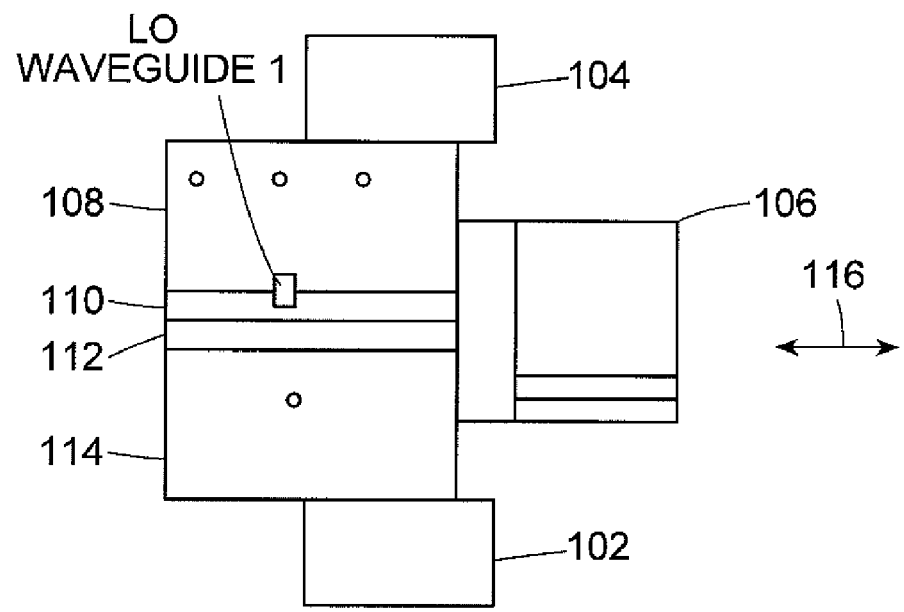
FIG. 2C is a side view of FIG. 2A.
Figure 2D:
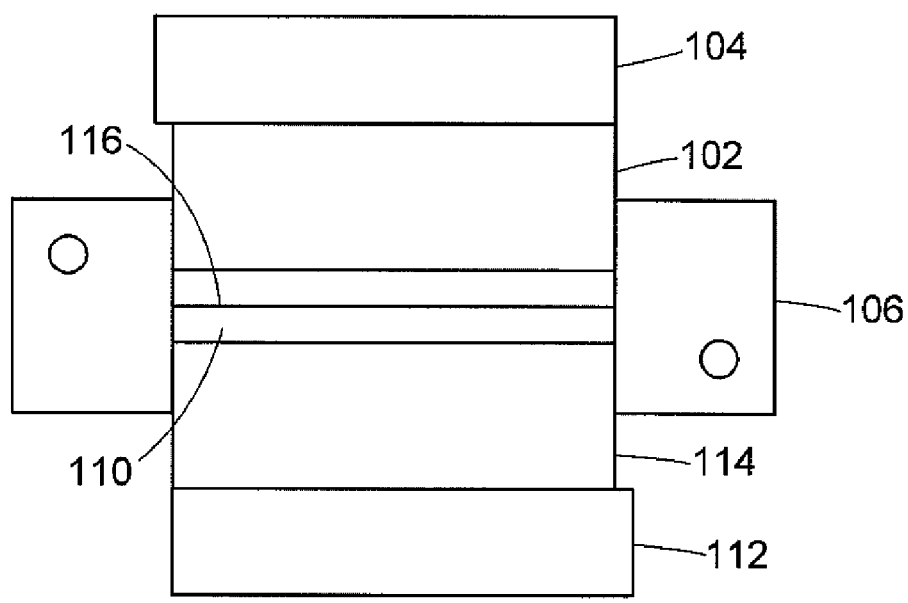
FIG. 2D is a rear view of FIG. 2A.
Figure 2E:
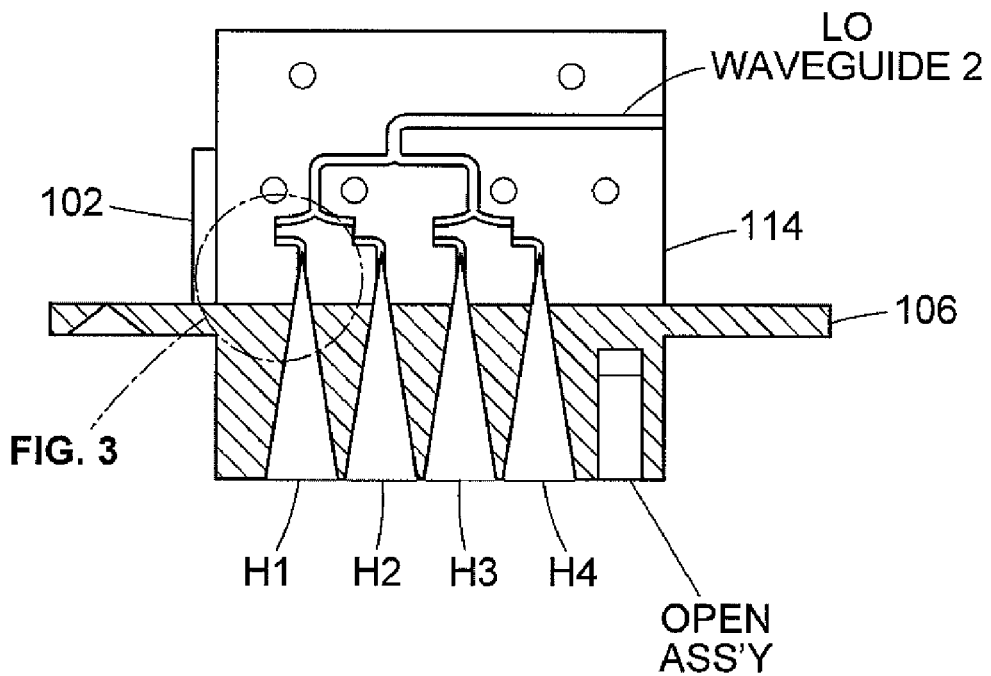
FIG. 2E is a top view of FIG. 2A cut along line 116 shown in FIG. 2C.
Figure 2F:
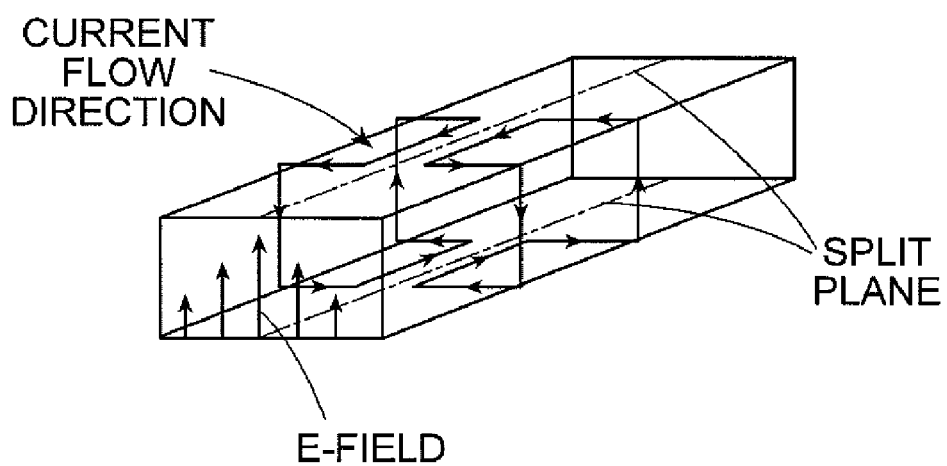
FIG. 2F shows the field and current distribution of TE01 mode in a waveguide.

FIG. 2B is a front view of the horn antenna mixer block assembly of the present exemplary embodiment, wherein the eight horn antennas are shown and the various apertures for dowel pins and screws are also shown. Blocks 110 and 112 are not shown in FIG. 2B. Note that for the sake of clarity, only the four bottom horn antennas (H1, H2, H3 and H4) are labeled; the other four horn antennas are shown located directly above the labeled antennas and skewed to the right. FIG. 2C shows a side view of the horn antenna and mixer block assembly of the present exemplary embodiment. One of the LO apertures representing the beginning of a waveguide (LO waveguide 1) that carries the LO signal is shown. Blocks 110 and 108 are machined so that the resulting LO waveguide 1 channel has a seam that is oriented in the direction shown by arrow 116 to minimize or significantly reduce the signal loss that occurs as the LO signal propagates through the waveguide. The fundamental mode propagated through waveguide is the $TE_{01}$ mode. Referring to FIG. 2F, the E field lies parallel to the narrow wall of the waveguide. In this instance, the solution to the well known Maxwell's equations gives the resulting direction of the current as maximum running along the centre line of the broad wall of the waveguide. In this instance, if the waveguide is manufactured in such a manner as to create a split along the centre line of the broadwalls face, then there is no requirement for the current to cross the split line. Therefore, there is no attenuation of the current due to any break or restive interface at this position. The resulting waveguide will behave as if it is made from a single cavity FIG. 2D is a rear view of the mixer, horn antenna block assembly. FIG. 2E is a top view of horn antenna mixer block assembly. The LO waveguide 2 shown in FIG. 2E is not the waveguide shown in FIG. 2C. The LO waveguide 2 in FIG. 2E is achieved from the machining of blocks 112 and 114 in the same manner as blocks 108 and 110 are machined to create LO waveguide 1 both structures machined to exhibit relatively little signal loss. Thus the waveguide shown in FIG. 2E is oriented in the same manner as the waveguide shown in FIG. 2C; the two waveguides are parallel but terminate on opposite sides of the mixer block assembly. Still referring to FIG. 2E, four antenna horns are shown interfaced to mixer block 114 (and 112). The conical apertures drilled into block 106 are such that part of each of such conical cavity has its end portion drilled into one or more mixer block; that is, the drilled conical cavity does not terminate in horn antenna block 106 but pierces through block 106 to end in a corresponding mixer block or mixer blocks. For example, horn cavities H1-H4 (see FIG. 2B) actually continue into mixer blocks 112 and 114 as shown in FIG. 2E; see also FIG. 4. A more detailed view of the structure of horn cavity HA1 is shown in FIG. 3. This manufacturing method results in a high performance antenna/waveguide transition which can be manufactured at speed. Typical return losses between waveguide and antenna are better than −27 dB.

Figure 2G:
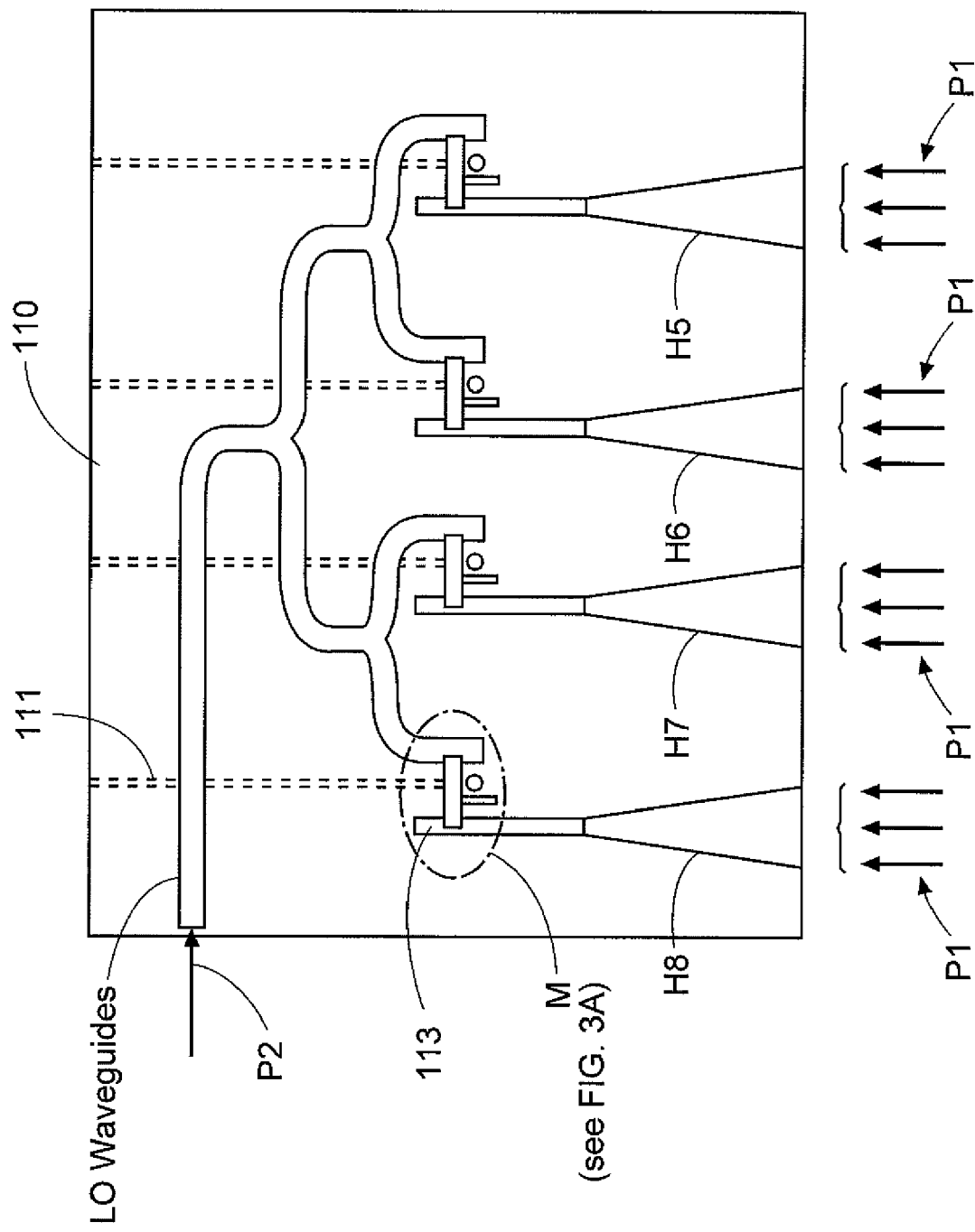
FIG. 2G shows the layout of the feed horn antenna, mixers and local oscillator distribution.
Figure 3A:
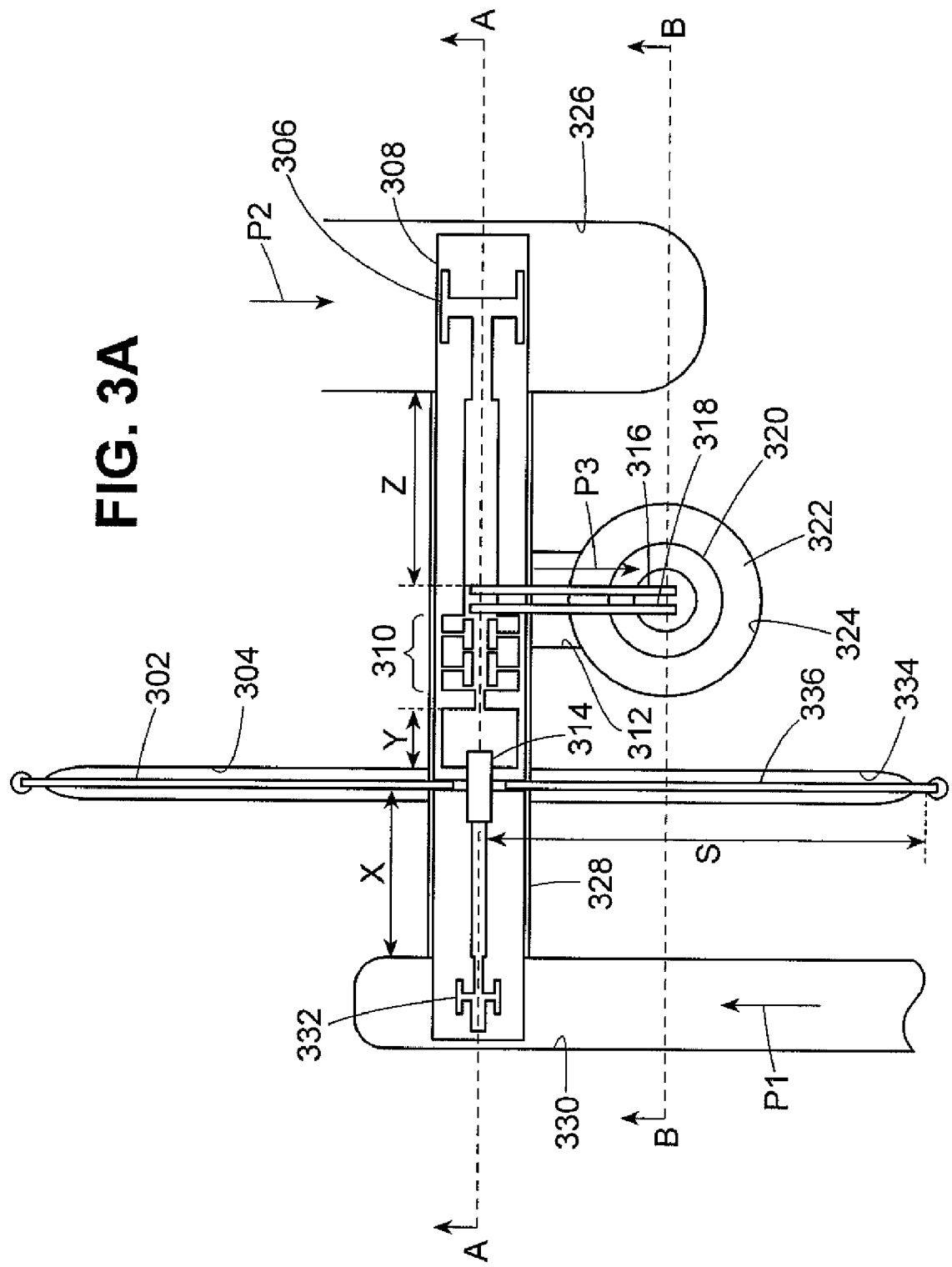
FIG. 3A shows a detailed plan layout of the mixer circuit.
Figure 3D:
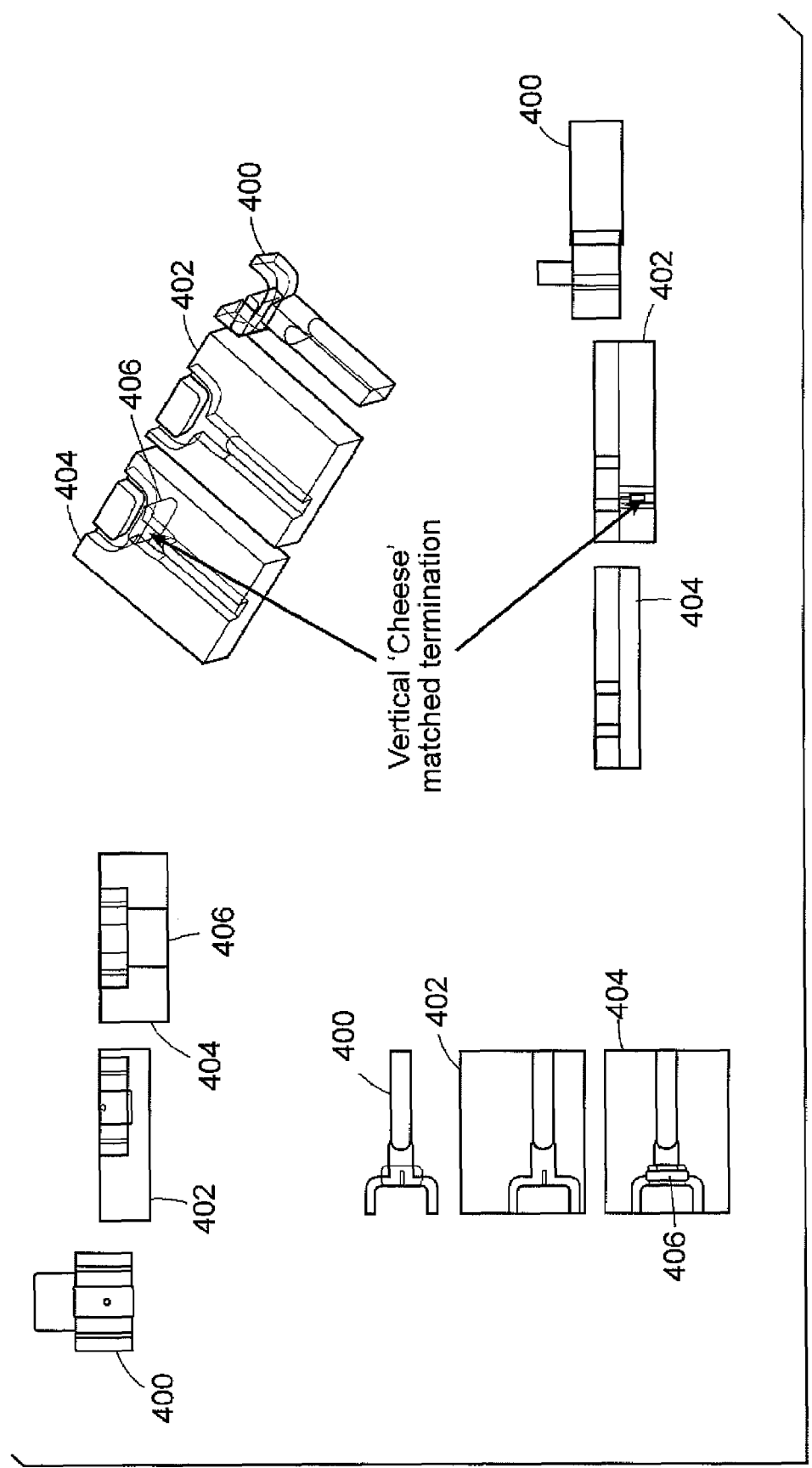
FIG. 3D shows the structure of the novel Magic T Local Oscillator power splitter.

FIG. 3 shows horn cavity HA1 having its end portion in a mixer block horn. The Horn cavity HA1 is drilled so that its end portion is in two mixer blocks 112 and 114 (see FIGS. 2A & 2C) which form the end portion of conical horn HA1. The end portion then is used as a guide for the drilling of the remainder of the horn waveguide. This method of drilling the horn cavity first and then using the end portion of the horn cavity as a guide when drilling the horn waveguide creates a horn waveguide structure that permits relatively very little reflections as a signal enters the horn cavity and travels through to the horn waveguide. FIG. 3 shows the mixer circuitry and how it couples with LO waveguide 2 and the horn waveguide for HA1. The LO waveguide 2 as well as LO waveguide 1 comprise branches of waveguides that couple to each of the four horn cavities (see FIGS. 2A, 2C & 2E). FIG. 2G shows another top view of the mixer block assembly; this top view shows the structure for LO waveguide 1. A close up view of one of the mixer/filter circuit of FIG. 2G is shown in FIG. 3A. FIGS. 3B and 3C show the mixer/filter structure of FIG. 3A along lines A-A and B-B, respectively. The branch structure of the two LO waveguides can be seen in a perspective exploded view of the mixer block and horn antenna block assembly of the transceiver of the present invention of FIG. 4. The design of the mixer and local oscillator distribution network is critical in determining an even split of the local oscillator power between the four mixers in each half of the array. The power is split evenly using the Y splitter shown in FIG. 2E and schematically in FIG. 2F and FIG. 3, due to the symmetry of the position of the vane machined within the LO waveguide relative to the narrow dimension, Whilst this approach is simple to implement, even performance operation of the mixers relies on achieving a good match at the output of the two branches of the Y splitter. If there is a significant reflection from one or more of the mixers then this will induce an imbalance in the LO signal distributed to each mixer. Where there is an equal mismatch at each mixer then the distribution will be equally distributed but the relative path length between the mixers then becomes important as the phase of the returned signals should be equal if they are to recombine and propagate out of the input of the Y splitter. Any imbalanced signal reflected from the mixers will be accentuated by the inability of the simple Y splitter to isolate the two output arms. The result of this effect will result in more power to be sent to one mixer than the other resulting in one of the mixers receiving insufficient LO power to achieve best performance and the other to receive too much LO power such as to increase the mixers noise. To a first order this can be accounted for by applying more Local oscillator power but this is wasteful and does not provide the most efficient solution. For optimum performance it is desirable to achieve each mixer tuning on at the same power level and achieving the optimum noise response.

With the use of the Y splitter to distribute the LO power it important that each mixer is identical to the other and likewise the diodes are well matched. The level of balance achievable is directly related to the accuracy to which the various devices tolerances can be maintained. Experience has shown that by using commercial micro-assembly manufacturing techniques then sufficient accuracy can be achieved to manufacture suitably balanced arrays to around 300 GHz. At this point an alternative approach is required.

In order to alleviate this problem a four port device can be implemented instead of a three port Y splitter. Such a device could be a Magic T or Rat race Hybrid. If either of these devices is to be used it is important that the space constraints associated with mixer arrays utilized in imaging applications are appreciated. When maximum optical resolution is required the mixer elements need to be spaced approximately 2λ where λ is the wavelength of the electromagnetic radiation used. At 250 GHz this length is 2.5 mm which is insufficient a distance for a rat race hybrid to be used at the local oscillator frequency of 125 GHz, i.e., the maximum dimension for the width of the four port hybrid must be less than λ at the local oscillator wavelength. The format of the four port device must also lend itself to direct machining or micromachining. Conventional Magic T and Rat Race Hybrid require a high performance termination which is almost impossible to fit within the allowable space envelope.

A novel magic T design which can be directly machined into the existing space envelope is shown in FIG. 3A. This design conforms to direct machining techniques and in addition meets the λ/2 width requirement. The basic design is shown in FIG. 3A. It utilizes a very short length vertical placed Cheese termination. In addition, the performance of the Magic T is shown in FIG. 3B. This plot demonstrates good input match of better than 20 dB and isolation of approximately 17 dB between output arms.

For higher frequencies than 300 GHz where manufacturing tolerances make channel balancing difficult to achieve this new design of magic T can be implemented. Indeed its use at lower frequencies may have some benefits in relaxing the assembly tolerances required and hence reduce the cost of manufacture.

FIG. 4 shows how the various mixer blocks (104, 108, 110, 112, 114 and 102) are attached to horn antenna block 106 with various screws and dowel pins. FIG. 4A shows additional parts attachable to the mixer block horn/block assembly. The present mixer array utilizes commercially available 2-18 GHz low noise amplifiers. Such components use standard coaxial connectors such as the Anritsu K type connector. Such connectors cannot be used for the compact mixer array as described here simply because their physical dimensions are too large. In order to meet the space constraints the mixer arrays IF outputs are taken through a proprietary subminiature connector that conforms to the spacing requirement. This is then mated to the standard K type connector of the amplifier via a proprietary connector designed to provide a reliable mechanical connection and isolation from spurious external RF signals such as mobile telephones and wireless networks that might be present in normal working environments. If these are not isolated from the low noise amplifiers then they would interfere with the very weak down converted signal. FIG. 4A shows this interface detail.

Referring now to FIG. 5, there is shown one end portion of LO waveguide 2 and how it interfaces with a defined area for placement mixer/filter component which also interfaces with horn waveguide for horn cavity HA1. It will be understood that the remaining horn cavities interfaced to LO waveguide 2 and the other four horn cavities interfaced to LO waveguide 1 are arranged and have a substantially similar structure to that shown in FIG. 5 for horn cavity HA1. Note that a circular opening having a portion of a pin residing therein is part of the IF filter pin/Glass bead assembly whose output is an IF output.

Figure 6:
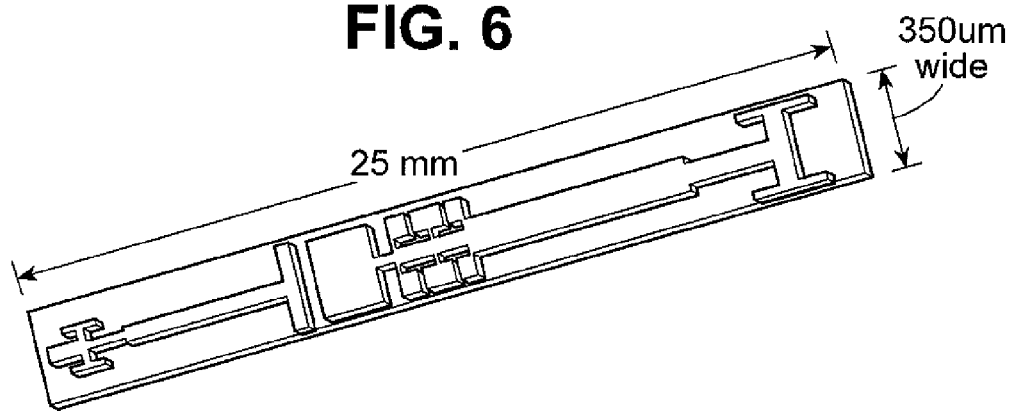
FIG. 6 shows the quartz filter assembly and its dimensions for a particular embodiment of the transceiver of the present invention.

Referring now to FIG. 6, there is shown a filter component made from a gold coated quartz substrate. The filter component for one embodiment of the present exemplary embodiment is shown as being approximately 2.5 millimeters long and 350 micrometers wide. The quartz substrate is approximately 75 micrometers thick. The gold coating is etched away using photolithography and the remaining gold forms an electrical circuit including one filter LPF1 and tuners (see FIG. 1) and a filter antenna at each end. The end antennas are referred to as "filter antennas" to distinguish them from the horn antennas already discussed with respect to the mixer block assembly. The filter antennas are respectively positioned in the LO waveguide and the horn waveguide, each forming a mode converter as discussed with respect to FIG. 1. It should be noted that the present exemplary embodiment is not limited to the filter, tuner and antenna circuitry as shown in FIG. 6. Circuitry of any particular geometrical characteristics that allows the proper reception (e.g., proper filtering, tuning, mixing) of signals having sub-millimeter wavelengths (and/or signals having wavelengths of 1 millimeter or more) can be used in the transceiver of the present exemplary embodiment.

Figure 8:
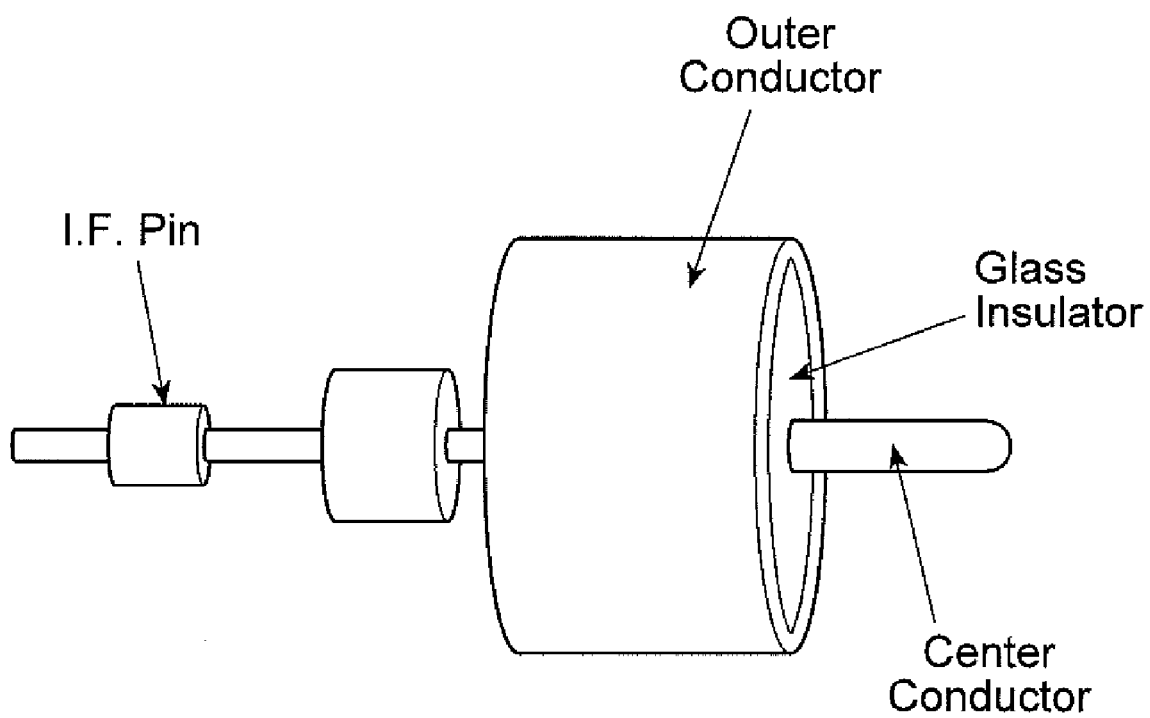
FIG. 8 shows the IF filter pin/Glass bead assembly used a filter in one embodiment of the transceiver of the present invention.
Figure 9:
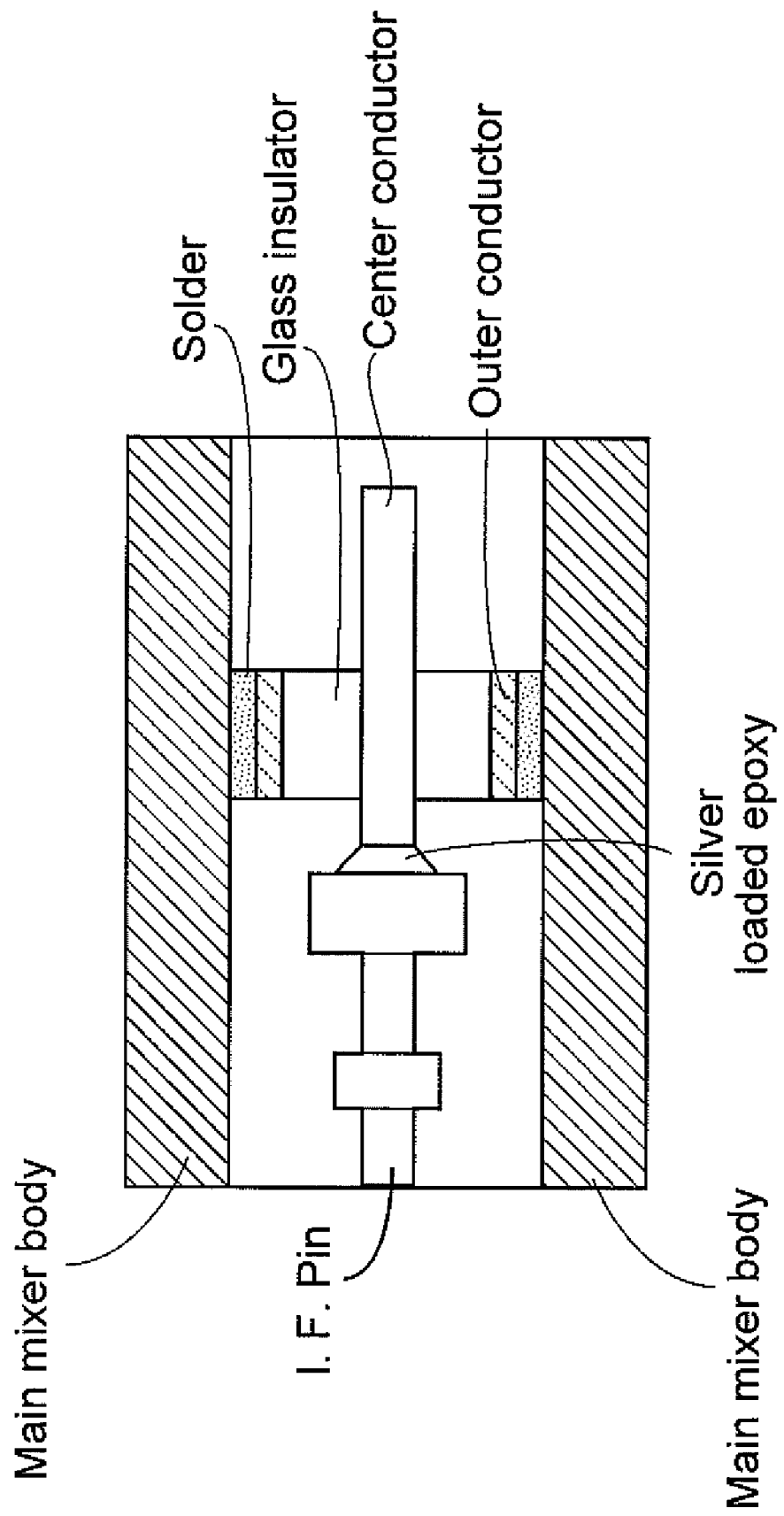
FIGS. 9-11 shows various structures and/or versions of the IF filter pin/Glass bead assembly.
Figure 10:
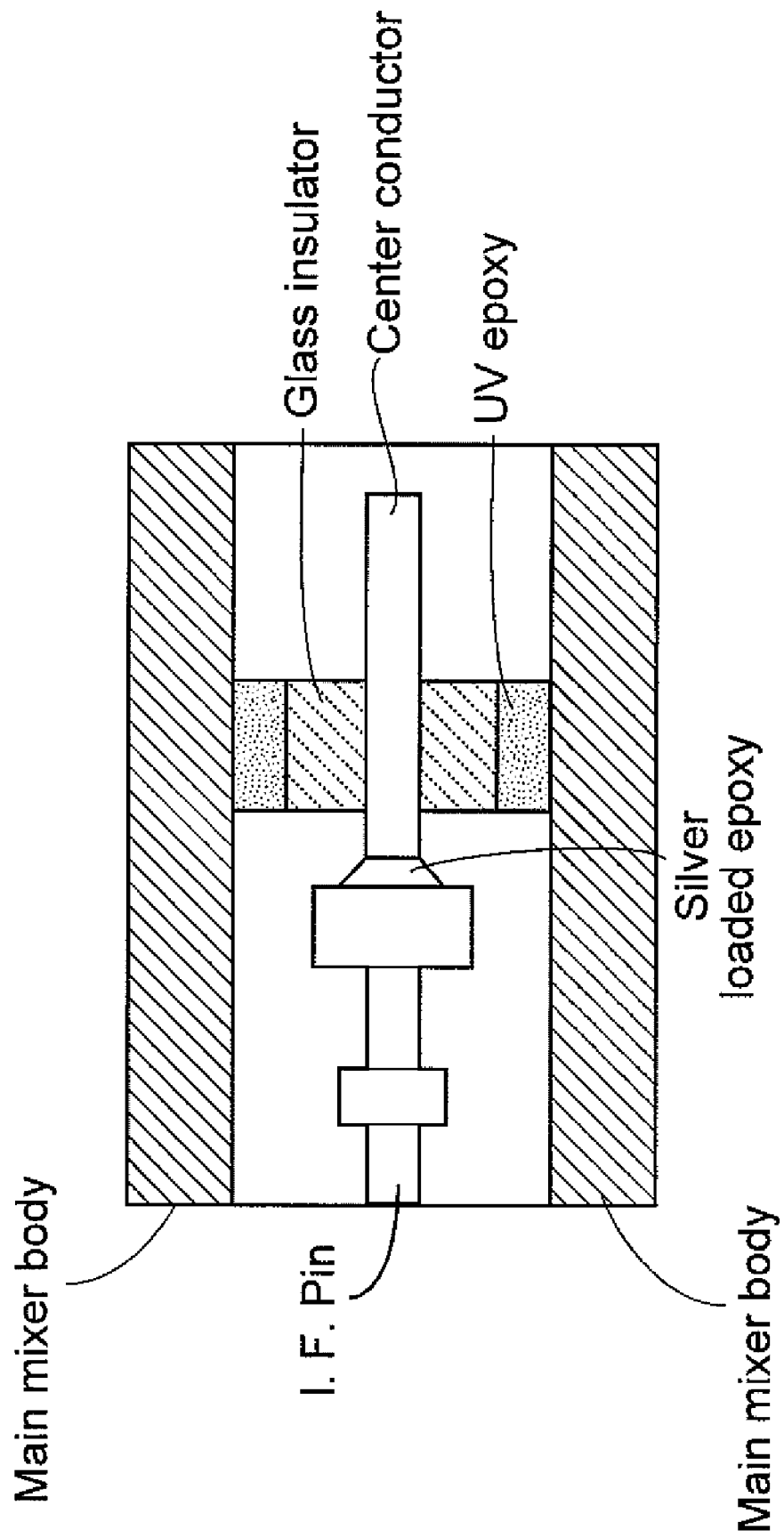
Figure 11:
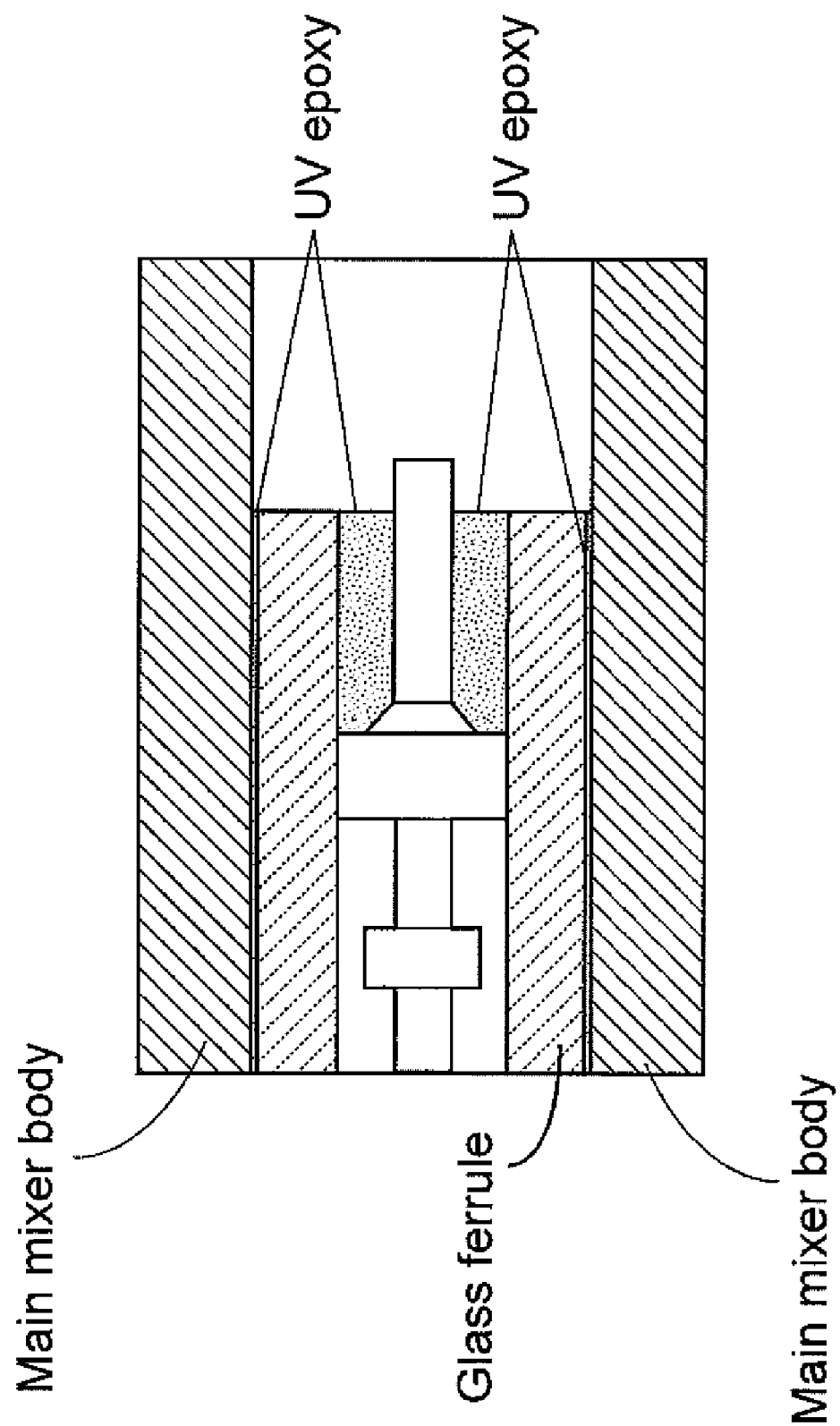

FIG. 7 shows the filter and other circuitry shown in FIG. 6 positioned in the defined area shown in FIG. 5 with the diode mixer mounted on such circuitry and wire connections to the IF pin and the mixer block the connections to the mixer block form both DC, IF, Local oscillator and RF signal grounds. The filter (including filter antennas) quartz substrate is mounted using curing epoxy in the defined area. The quartz slab is then mounted in the defined area and is cured off with an ultraviolet lamp. The IF pin constitutes part of LPF2 is mounted in a cavity of the mixer block on which the mixer/filter is positioned. One particular structure of the IF pin is shown in FIG. 8. The IF filter pin shown in FIG. 8 is machined from brass and electroplated with approximately 2 micrometers of gold and is then attached to a glass bead using silver loaded epoxy. The filter pin is soldered in place at 90 degrees (or substantially perpendicular) to the mixer/filter component thus enabling a reduction in size of the overall mixer. Referring back to FIG. 2C, for the moment, the filter pin/Glass bead assembly is placed in a cavity that is oriented in a direction that is perpendicular to arrow 116. Each horn antenna represents a channel and thus each channel size is reduced with the IF filter pin mounted at 90 degrees with respect to mixer/filter circuit. Various IF filter pin/Glass bead structures embedded in a mixer block (labeled "main mixer body") are shown in FIGS. 9-11. FIG. 9 shows a typical assembly of the filter pin. FIG. 10 shows a filter pin with no outer conductor. The entire assembly can be UV cured into position, thus eliminating the need for solder further facilitating the manufacture of the mixer assembly of the transceiver of the present exemplary embodiment. FIG. 11 shows yet another filter pin arrangement where the entire pin including a center conductor is placed in a glass (borosilicate or similar) ferrule. The assembly can then be UV cured into place and the ferrule/glass bead filter pin could be UV cured into the mixer block.

Figure 12:
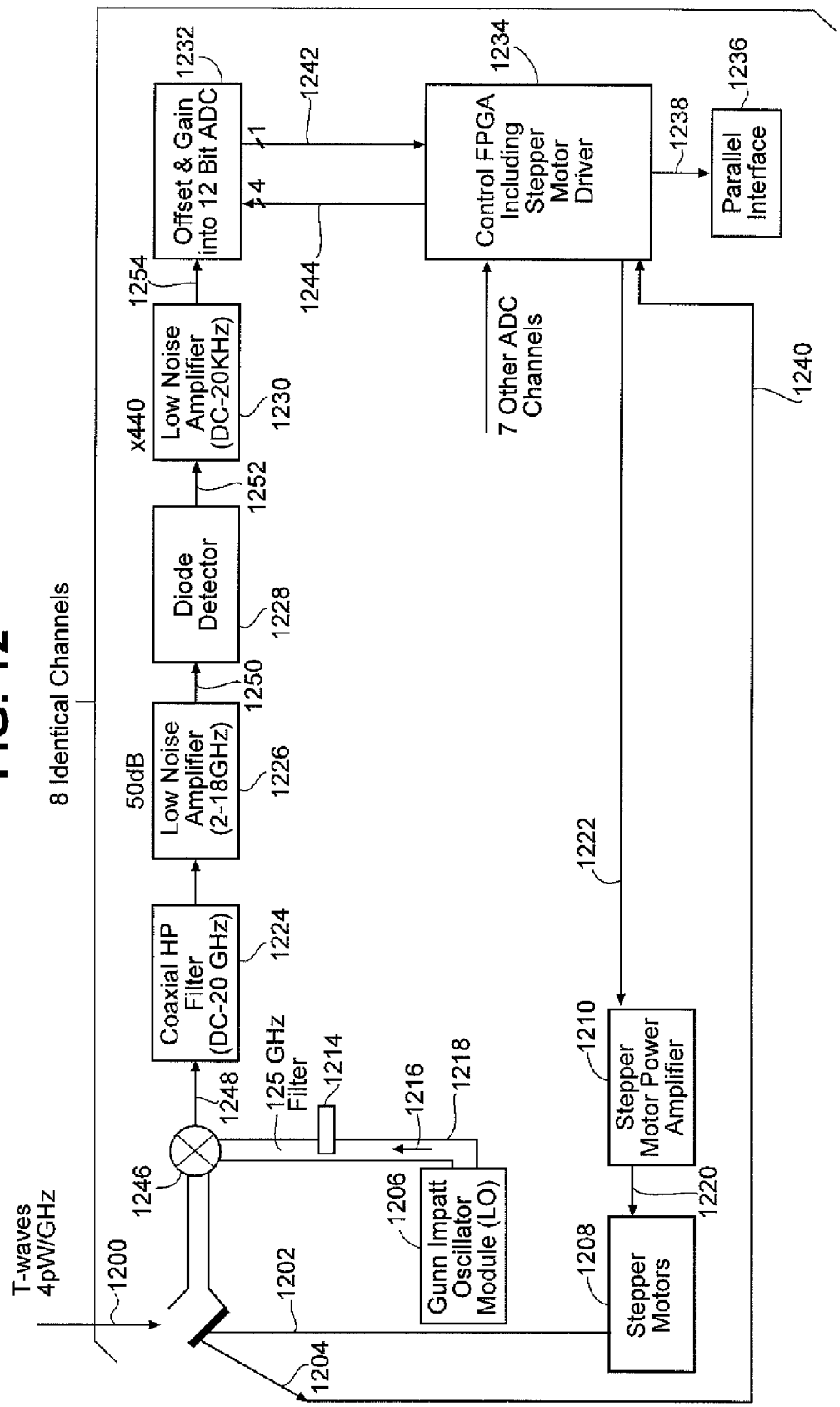
FIG. 12 shows one embodiment of the transceiver of the present invention in which stepper motor driven mirrors are controlled to guide signals from an object into an antenna of one embodiment of the transceiver of the present invention.

One application of the transceiver of the present exemplary embodiment is to use such a device as a receiver of radiation emitted from objects and/or persons being scanned and create an image of the scanned object and/or person using a plurality of channels each of which is arranged as shown in FIG. 12. That is, for the system shown in FIG. 12, there are 8 channels and thus for the sake of clarity, only one channel is shown with the understanding that the other seven (7) channels are identical. Submillimeter waves (T-waves) are guided into a receiving horn antenna by two mirrors (not shown) one being a stepper motor driven deflection mirror. The stepper motor arrangement also uses the position and direction of the main deflection mirror while it is scanning an object to allow the object to be imaged. The beam waist of the horn antenna is designed to match the beam waist of the optics over the widest frequency range. The input signal flow is shown in FIG. 1.

The main deflection mirror is driven by an offset bearing giving a sinusoidal characteristic. To avoid using the nonlinear portion of the sinusoidal curve, the image is "overscanned," meaning that over the scan arc 0 degrees to 180 degrees only the data from the region between roughly 20 degrees and 160 degrees are actually used. This makes the data points reasonably linear with the image. As the frame scan is discontinuous, it is possible to linearize the frame scan simply by putting out different numbers of pulses at the end of each line. This optimizes the scan speed since there is no dead time and no wasted scans. Two schemes are used.

The first scheme is as follows: given the vertical resolution and the square image, it makes no sense to have a horizontal resolution that is more than double this. The horizontal resolution is therefore somewhat arbitrarily set to 96 pixels, making the whole image 4608 pixels. The key concept in the following table is to round the numbers such that convenient rotational speeds and data acquisition rates are achieved.

| Frame Rate (fps) | Horz Scan Time | Horz Scan Time | Horz (rev/s) | Horz (steps/s) | Active Scan Time | Frame Scan Time | Pixel Rate (per channel) pixels/s | Pixel Time |
|---|---|---|---|---|---|---|---|---|
| 1 | 6 Hz | 166.7 ms | 3 | 1200 | 128 ms | 38.6 ms | 750 | 1333 μs |
| 2 | 12 Hz | 83.3 ms | 6 | 2400 | 64 ms | 19.3 ms | 1500 | 667 μs |
| 5 | 30 Hz | 33.3 ms | 15 | 6,000 | 25.6 ms | 7.73 ms | 3750 | 267 μs |

Notes:
1) we get two horizontal scans per revolution of the stepper motor.
2) uses 400 steps per revolution stepper motor.

2) uses 400 steps pre revolution stepper motor.

The stepper motor resolution is not being taken into account on the line scan. The mirror is assumed to move uniformly due to its inertia. Therefore the amount of overscan is calculated on the basis that the active portion of the scan is 128 ms in the 166.67 ms period.

Both stepper motors drive high inertial loads, the line scan requiring a much faster speed. The drive requirements for the line scan are therefore quite different to those for the frame scan. The line scan is driven at a fixed frequency in the steady state, but the inertial load is too high to achieve the full speed immediately. It will therefore be necessary to ramp up to full speed gradually.

The frame scan consists of 400 steps per revolution, giving 200 steps per scan. If scanned uniformly in terms of steps this means 40 steps per line position. Note that there are 6 lines but only 5 gaps. By using 3 different gap spacings the resultant scan is made more linear.

| Line Number | Frame Gap (steps) | Line Number |
|---|---|---|
| 1 | ← | 12 |
| ↓ | 59 | ↓ |
| 2 | | 11 |
| ↓ | 28 | ↓ |
| 3 | | 10 |
| ↓ | 26 | ↓ |
| 4 | | 9 |
| ↓ | 28 | ↓ |
| 5 | | 8 |
| ↓ | 59 | ↓ |
| 6 | → | 7 |

At 1 frame per second the line scan does 1200 steps per second. The slowest uniform step rate possible on the frame is 60 steps in 38.6 ms, a rate of 1554 steps/second. The frame drive is therefore also required to have an acceleration profile.

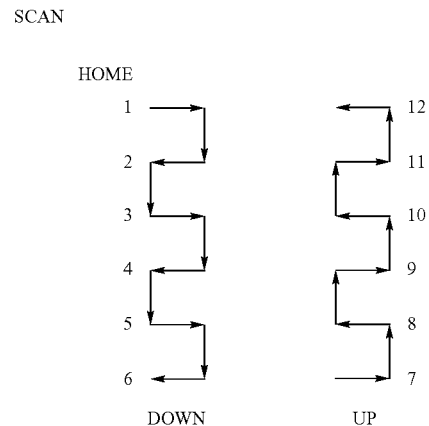

Synchronization

The acquisition system needs to be synchronized to the mirror mechanism. This is done in several stages. Opto switches on the frame and line scans give the start/end of the mirror movement. The first step is to re-clock inputs in opto-sync.vhd, entity opto. The LineSync entity LineSync.vhd does the primary synchronization of the line scan. Process AutoRunning creates the master synchronization signal DataValid. The DataValid signal runs all the time, regardless of the presence of the Line opto sensors.

The process FindSyncOut creates its own DataValid lookalike pulse, SyncOut. This SyncOut pulse is used to synchronize the DataValid pulse in the process AutoRunning but only until the StopSync line goes high. StopSync is supplied by the startup sequencer. The two key outputs of the LineSync process are the DataValid pulse and the GoingRight signal. These totally define the synchronization of the line scan.

The Second Scheme

The first scheme produces a rectangular image taller than it is wide. This is due to the optics and the feed horn pattern. In order to get a square picture using the same optics and feed horn pattern, it is necessary to change the scan pattern.

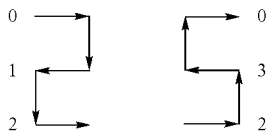

This scheme has 3 lines per frame, but the last line in any frame is the first line of the next frame. This allows the frame rate to be significantly faster. Note that at the end of each line the frame steps a full quarter of a revolution (100 steps); this is very convenient in terms of the stepper motor drive algorithm. Stay with 96 pixels horizontally . . . .

| Frame Rate (fps) | Horz scan Speed | Horz Scan Time | Horz (rev/s) | Horz (steps/s) | Active Scan Time | Frame Scan Time | Pixel Rate (per channel) pixels/s | Pixel Time |
|---|---|---|---|---|---|---|---|---|
| 1 | 2 | 500 ms | 1 | 400 | 384 ms | 116 ms | 250 | 4 ms |
| 2 | 4 | 250 nm | 2 | 800 | 192 ms | 58 ms | 500 | 2 ms |
| 3 | 6 | 167 ms | 3 | 1200 | 128 ms | 38.6 ms | 750 | 1.3 ms |
| 4 | 8 | 125 ms | 4 | 1600 | 96 ms | 29 ms | 1000 | 1 ms |
| 5 | 10 | 100 ms | 5 | 2000 | 76.8 nm | 23.2 nm | 1250 | 0.8 ms |

To allow the system to scan at different speeds it is convenient to use a relatively high post detection bandwidth and to digitally filter the acquired data. It is important to use minimal possible bandwidth at any particular scanning speed in order to minimize the noise to achieve the best possible signal to noise ratio. The digital subsystem acquires data up to more than 500× faster than is necessary to generate pixels on the display device. These are then digitally filtered to both oversample the data and band limit it. The effect is to give 16 bit data from 12 bit data and to reduce the bandwidth to the minimum necessary to give a good compromise between low noise and blurring of the image.

Sub-millimeter wave signals radiating from (or reflecting off) objects have amplitudes that are proportional to the temperature of the object. Thus reference points for coldest and hottest objects that can be imaged by the transceiver of the present exemplary embodiment can be established by associating corresponding amplitudes (and/or power levels) to such temperatures. Thus, at the start of each scan "cold" and "hot" reference voltages are established for the object being imaged. The image is then generated for signals whose temperature fall within the two reference signals.

Methods For Assembling the Transceiver of the Present Exemplary Embodiment

A discussion on the proper construction and/or assembly of the transceiver of the present exemplary embodiment follows. Also, the various testing techniques used during and after assembly of various portions of the transceiver of the present exemplary embodiment are discussed. The methods and processes used in constructing, assembling and testing of the transceiver of the present are part of the present exemplary embodiment.

As discussed earlier and in reference to FIG. 4, the transceiver comprises a block assembly where some of the blocks engage each other to form waveguides that are part of a mixer structure. Referring to FIG. 5, the block assembly comprises several blocks (i.e., 102, 104, 108, 110, 112, and 114 each of which is constructed from conductive material such as brass, gold or other metal or an appropriate alloy. Prior to the construction and/or assembly of the transceiver of the present exemplary embodiment, several cleaning solutions and/or chemical solvents (e.g., Acetone) are provided. At least some of the chemical solvents can be classified as irritants and thus the wearing of gloves and eye protection gear by assembly persons is highly recommended. Further, due to the nature and size of various electronic components used in the transceiver, the wearing of ESD (ElectroStatic Discharge) wrist strap and use of ESD safe benches is highly recommended. The various parts of the transceiver structure of the present exemplary embodiment are not only sensitive to ESD, but also to dust and grease; this is another reason why an assembly person should wear gloves. In addition to the cleaning solutions, various other products are used to construct the transceiver of the present exemplary embodiment. Such products are, for example, Ultra Violet (UV) curing Epoxy (Norland 61), Silver Loaded Epoxy (e.g., Epotek H20E), Isopropyl Alcohol (IPA), Acetone, De-Ionized water (DIA), solder (e.g., Indalloy #4 solder), Cotton Swabs, cocktail sticks, laboratory filter paper, standard glass slides, vacuum released gel-packs, gold probes (e.g., 7 μm probes) and superflux. All of the mentioned products are to be maintained in the correct environments and be handled properly to reduce contaminants in the assembly of the transceiver structure of the present exemplary embodiment.

I. Filter Assembly

The entire assembly is to be performed under lamina flow. In the first step, the filters used in the transceiver of the present exemplary embodiment are inspected to sort out any damaged filters and to make sure that the filters are clear of contaminants. The selected filters are then cleaned as per the following procedure:

1. Completely submerge the filters in De-Ionized water in a Petri dish.
2. Place the Petri dish in an ultrasonic bath and run for 5 minutes.
3. Remove the Petri dish from the ultrasonic bath.
4. Fill another Petri dish with IPA and transfer the filters with tweezers from the De-Ionized water to the IPA.
5. Place the filters/IPA into an ultrasonic bath and run for 5 minutes.
6. Remove the Petri dish from the ultrasonic bath.
7. Fill another Petri dish with Acetone and transfer the filters with tweezers from the IPA to the Acetone.

8. Place the filters/Acetone in an ultrasonic bath and run for 15 minutes.
9. Remove the Petri dish from the ultrasonic bath and place the filters with tweezers on a glass slide immediately prior to use.

In the third step, use glass slides to place each of the filter substrates on a glass slide. In the fourth step, the filters' operation is tested using either (i) a curve trace test or (ii) an ideality factor and Series resistance test or both.

(i) Curve Trace Test

Figure 13:
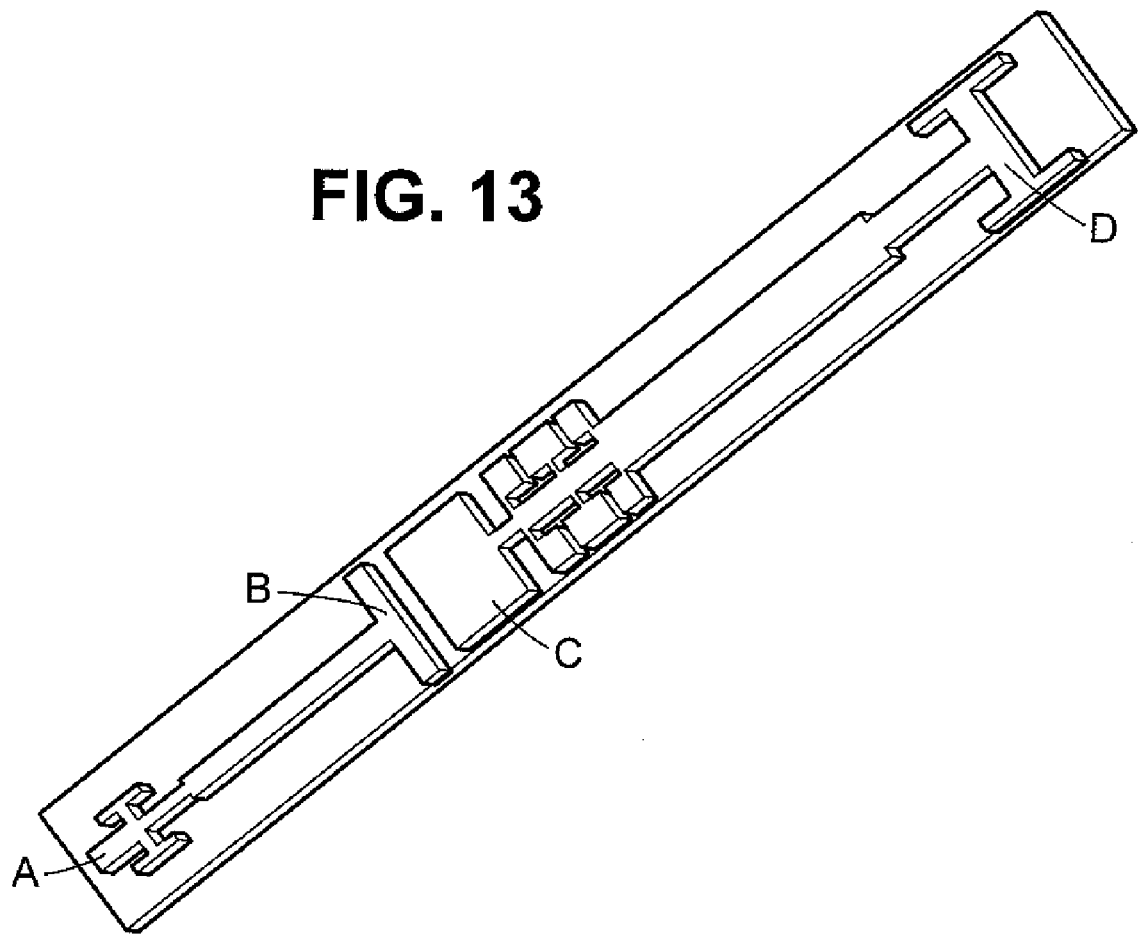
FIG. 13 shows the mixer filter assembly and various specific points to be probed while assembling the mixer block portion of the transceiver of the present invention.

The objective of this test is to check electrical continuity of the filter structure. Gold plated probe tips are used and they are connected to a suitable curve trace setup or other machine that tests for electrical continuity. The points to be probed are identified by an assembly note which can be generated by the manufacturer of the filter. FIG. 13 shows the specific points (A-B and C-D) to be probed for the filter embodiment being discussed herein. Any filter that does not show a short circuit at these test points (i.e., short between A and B and short between C and D) is to be discarded.

(ii) Ideality Factor and Resistance Test

Various test points throughout the filter structure and diode test points are identified. Test probes are connected to these test points. Some of the test points are located outside of the transceiver and are accessible via connectors and cable assemblies connected to the transceiver. Ideality and series resistance between various specified test points are then measured with the test probe and computer equipment designed to measure such characteristics. The ideality factor and series resistance of the diode is measured. As is well known, the ideality of a diode is an adjustment factor used to correct for discrepancies between an ideal PN junction equation and an actual device. The ideality factor quantifies the quality of the junction of a diode.

Figure 14:
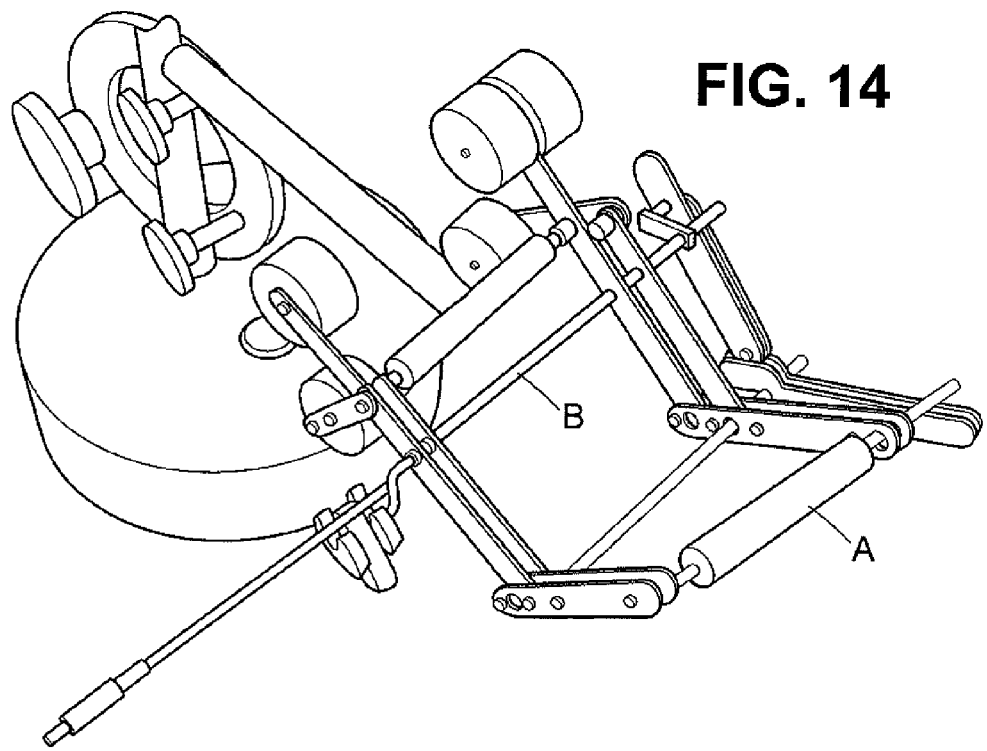
FIGS. 14-15 show the micromanipulator and how it is operated to assemble various components of the mixer block of the transceiver of the present invention.
Figure 15:
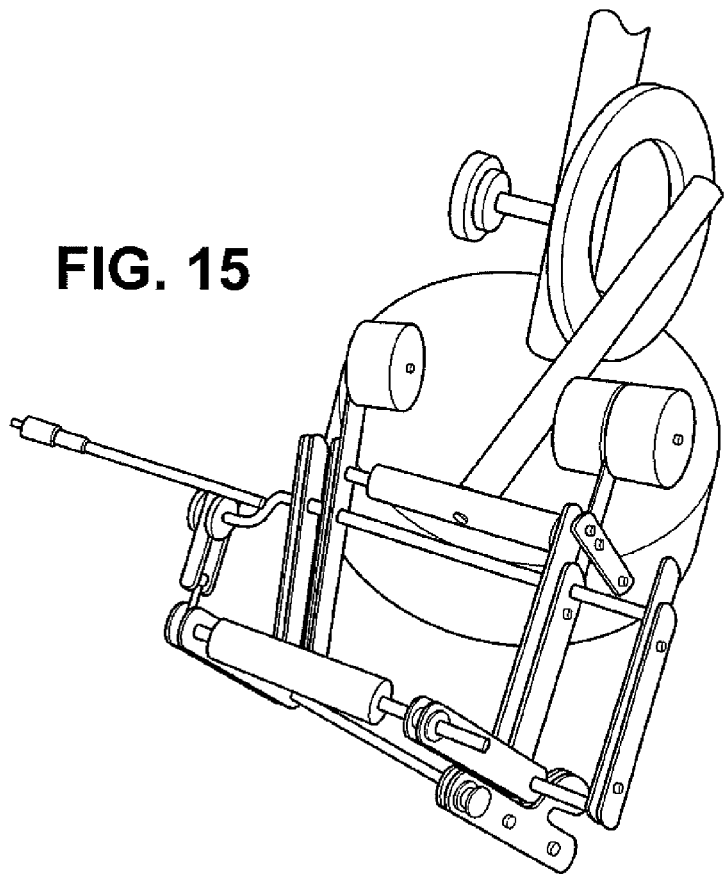

In the fourth step, using a device that allows one to manipulate relatively small components or objects (e.g., a micromanipulator), apply a small amount of super-flux (fresh not outdated superflux should be used) on the glass slide on which the filter is resting. Move the filter so that its corner is just touching the flux thus resulting in the filter being held in place. An example of a micromanipulator is a pantograph with a 10:1 movement which is used for small object assembly operations. A human hair is attached to a syringe tip where the hair has the appropriate diameter (~100 um) to handle small parts such as the diode used in the mixer circuitry for the transceiver of the present exemplary embodiment. The micromanipulator (Singer Instruments Mk.1 Micromanipulator) and how it is operated are shown in FIGS. 14 and 15. In particular, in FIG. 14, back handle A is manipulated making sure that it remains parallel to ensure proper manipulation of the syringe tip having a human hair attached to its end. FIG. 15 shows how the micromanipulator is handled.

In the fifth step, the micromanipulator is used to apply super-flux to an area of the filter that is to be soldered. Solder balls, which are to be kept in an air tight refrigerated container of acetone can be applied to the slide using a pipette. The acetone will quickly evaporate leaving a neat pile of solder balls. It should be noted that solder balls showing any sign of oxidization should not be used. The solder balls are prepared using solder paste as follows: H20E solder paste is stored in syringes which should be refrigerated at all times.

A small amount of solder paste is put into a Petri dish. The Petri dish is then filled with Acetone and the filled Petri dish is placed into an ultrasonic bath for 15 minutes. A funnel is placed into a suitably sized beaker; filter paper is inserted into the funnel. At the end of the ultrasonic filter bath, the Acetone is allowed to evaporate, the now formed solder balls are filtered into a Petri dish and they are cleaned again using acetone N more times where N is an integer equal to 1 or greater. Typically N equals 10.

After having cleansed the solder balls with Acetone several times, the solder balls are checked to see if there is any paste or organic residue; the solder are cleaned accordingly to remove any such residue and then they are kept in an airtight container in a refrigerator as described above. A device known as a hot plate is used to melt solder at precise temperatures to allows relatively small components of the mixer of the transceiver of the present exemplary embodiment to be soldered to each other. For this step, the hot plate is preferably heated to 135° C. and then, using the micromanipulator, the solder balls are placed in the areas to be soldered. Preferably one set of solder balls per side. It is essential that the solder balls are centrally placed on the filter substrate. Once the hotplate has reached 135° C., the glass slide is placed on the hotplate and the filter is observed underneath a microscope. The hotplate is removed immediately and is allowed to cool for 2 minutes. Using a pipette, DI water is applied to the slide directly over the filter making sure the filter is not accidentally sucked into the pipette. Move the filter and slide in the DI water then absorb the water with filter paper. Apply DI water again until the filter can be moved relatively easily on the glass slide.

In the next step, the filters are then cleaned as per the following procedure:
1. Diode filter assembly is placed onto a glass slide.
2. The filter assembly and glass slide are flooded with DI water.
3. The filter assembly is moved around in the DI water and then the water is removed using filter paper.
4. A separate pipette is used to flood the area with IPA.
5. The filter assembly is moved around in the IPA and then filter is used to remove the IPA.
6. Another pipette is used to now flood the same area with Acetone.
7. The filter is again moved around in the Acetone and then the Acetone is removed using filter paper.
8. Alternately flood the area with IPA and Acetone several more times to ensure that the filter is substantially clear of any contamination.

Once the cleaning is complete, super flux is re-applied to the previously flowed areas using the micromanipulator; the areas are left in this state so as to become tacky or sticky. A small amount of the flux is left on the tip of the micromanipulator which also will become sticky.

Using the micromanipulator, a diode, which has been preselected and tested to ensure proper operation, is carefully removed from a gel-pack. The diode is placed face down on the solder balls; that is the pads (preferably gold) on the diode are placed directly on the solder balls. The diode is preferably centrally positioned on the filter.

The hotplate temperature is set at 150° C. and once this temperature is reached the glass slide is placed on the hot plate. The resulting solder flow is observed under a microscope. As the solder flows, the longer side of the diode will become more parallel with the longer edge of the filter (will appear to be more square with respect to the filter metallization). Once the solder has flowed, the filter is removed from the hot plate and is allowed to cool for 2 minutes. The filter assembly is once again cleaned with DI water IPA and Acetone as described above. The cleaned filter is then tested for operation by probing at designated points as described above. The tested and clean filter is then stored in a clean uncontaminated gel-pack.

II. IF Filter Pin Assembly

Set hot plate for 80° C. Select a glass bead and IF filter pin. Preferably the glass bead is preferably manufactured by Anritsu and having part no. K102F. The glass bead and IF filter pin are cleaned as per the following procedure:
1. The glass bead and IF filter pin are completely submerged in De-Ionized water in a suitably sized glass beaker.
2. The beaker is placed in an ultrasonic bath having particular specifications for 15 minutes.
3. The beaker is removed from the bath and then the object is removed from the beaker and dried using a dry air spray followed by 5 minutes in an oven set to 110° C.
4. The object is then completely submerged in IPA in a suitably sized glass beaker.
5. The object is then placed in an ultrasonic bath for 15 minutes. The ultrasonic bath may have particular specifications that are listed and complied with.
6. The object is then removed from the beaker and dried using a dry air spray followed by 5 minutes in an oven set to 110° C.
7. The object is then completely submerged in Acetone in a suitably sized glass beaker.
8. The beaker is then placed in ultrasonic bath for 15 minutes. The ultrasonic bath may have particular specifications that are listed and complied with.
9. The beaker is removed from the bath and the object is removed from the beaker where such object is dried using a dry air spray followed by 5 minutes in an oven set to 110° C.

For smaller glass beads and IF filter pins, a different cleaning procedure can be used; the cleaning procedure used to clean the filters can be used for these smaller items/components.

Figure 16:
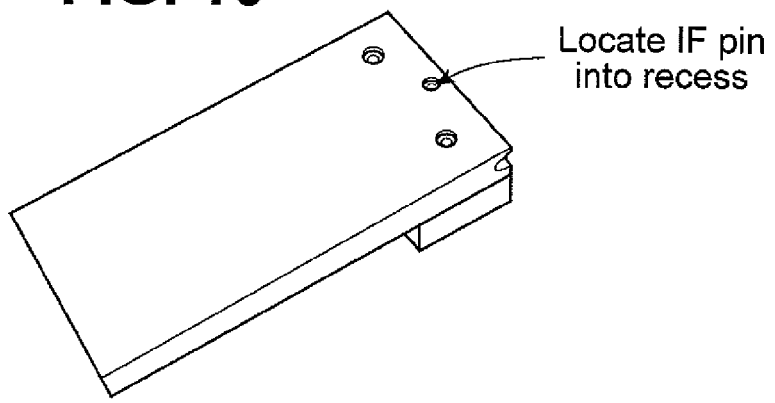
FIG. 16 shows a pin assembly fixture used to assemble the IF filter pin and a Glass bead.

An IF filter pin assembly fixture is used to properly assemble the IF filter pin and glass bead. The fixture is shown in FIG. 16 and it comprises a rectangular installation block (preferably metallic) having a cavity within which the IF filter pin is inserted. One end of the installation block is mounted on a smaller block as shown. The IF filter pin is placed or inserted into a cavity of the installation block. The IF pin is so positioned within the installation block (i.e., the IF filter pin assembly fixture) to expose one of its end that has a filter pin hole or cavity; the IF filter pin hole is now ready to receive one of the conductors of the glass bead. The installation block and IF filter pin are to be kept clean and free of contaminants. If either the installation block of the IF filter pin needs cleaning, repetitive applications of De-Ionized water and IPA as per the procedure above can be used. In the next step, the glass bead is prepared for engagement with the IF filter pin. First, a relatively small amount of pre-mixed silver loaded epoxy is decanted onto a glass slide. Second, using a properly cleaned probe pin, a relatively small amount of silver loaded epoxy is then applied to the end of the shorter center conductor of the glass bead. It is noted that the probe pins used to electrically probe the diode and filter are kept separate from the probe pins used for assembly of parts such as the glass bead and IF filter pin. The glass bead is now ready to be assembled with the IF filer pin currently placed in the installation block.

In the next step, the longer center conductor of the glass bead is securely held with a pair of tweezers. The glass bead is then slid into the IF pin assembly fixture (i.e., the installation block) such that the conductor having the epoxy thereon is positioned within the IF filter pin hole. The bead is twisted slightly to ensure good contact between the bead conductor and the IF filter pin hole surface. The tweezers are to be kept clean of hardened contaminants and cleaned using repetitive application of IPA and De-ionized water. The smaller rectangular block is attached to the IF pin/bead assembly fixture to secure the IF pin filter/bead assembly. The IF pin/Glass bead assembly fixture is then placed in an oven set at 120° C. for 20 minutes. Afterwards, the IF filter pin/Glass bead assembly is tested for continuity with test probes using techniques and equipment already discussed above for the curve trace test and the resistance test. In particular, probe pins are used to test for continuity between the center conductor of the bead and the barrel portion of the bead (see FIG. 8); there should be no continuity between these two points for a properly operating IF filter pin/Glass bead assembly. Similarly, probe pins are used to test for continuity between the IF pin and the bead center conductor; there should be continuity for between these two points for a properly operating device. The IF filter pin/bead assembly should be cleaned using repetitive application of De-Ionized water and IPA as described above.

In the next step the IF pin/Glass bead assembly is tinned using the following procedure: A relatively short length of Indalloy solder #4 is placed onto a glass slide. The glass slide is then place onto a hot plate. Some super flux is applied to the outer conductor of the IF Pin/Glass bead assembly. The IF pin/Glass Bead assembly is then placed onto the glass slide. Once the solder begins to flow, the IF pin/Glass Bead assembly is rolled along the length of the solder. Care is taken to ensure that no solder flows anywhere other than the outer conductor of the IF pin/Glass Bead assembly. Once a suitable layer of solder (approximately 100 μm) has flowed around the outer conductor the slide is removed from the hot plate and the IF pin/Glass Bead assembly is allowed to cool, The assembly can then be cleaned using repetitive application of De-ionized water, IPA and Acetone.

III. Mixer Assembly

Figure 17:
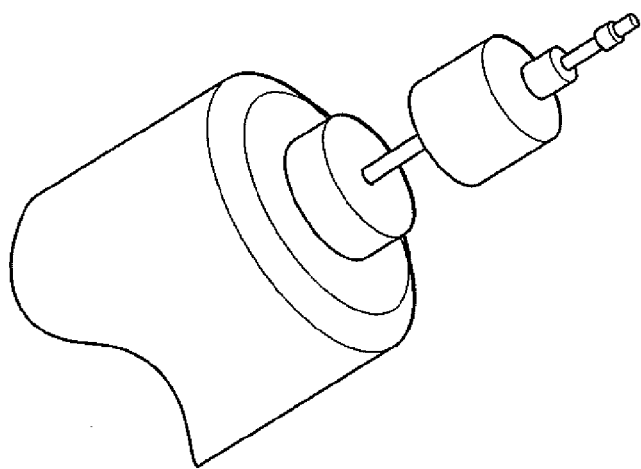
FIG. 17 shows how the Glass bead is installed in a bead centralizing jig during prior to tinning.
Figure 18:
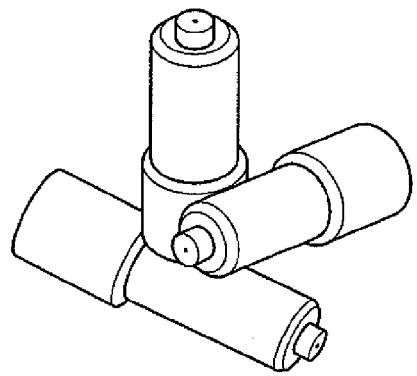
FIG. 18 shows several bead centralizing jigs.
Figure 19:
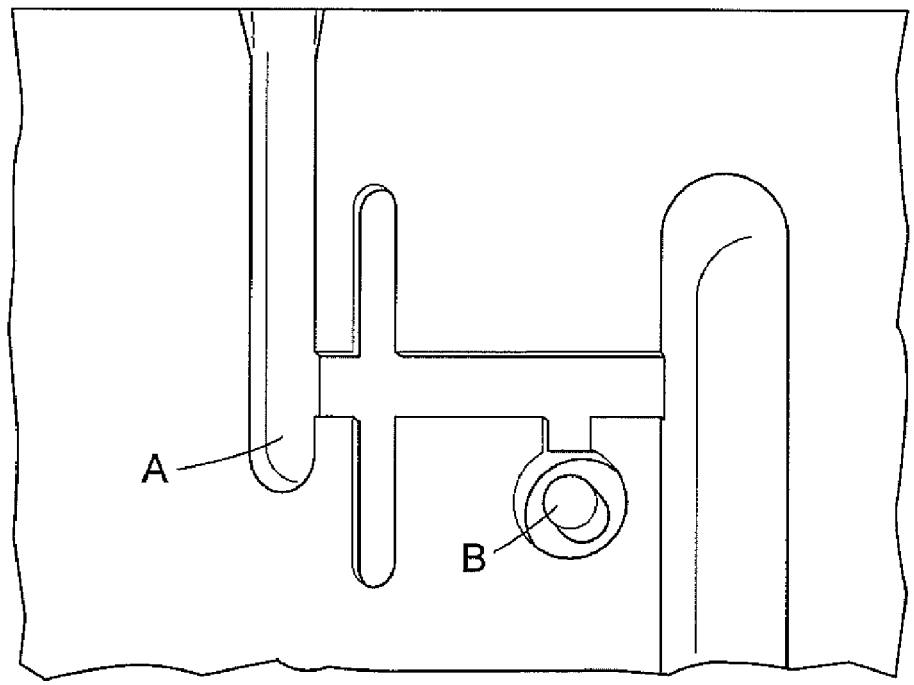
FIG. 19 shows probe points within the mixer block for testing the IF pin during assembly.
Figure 20:
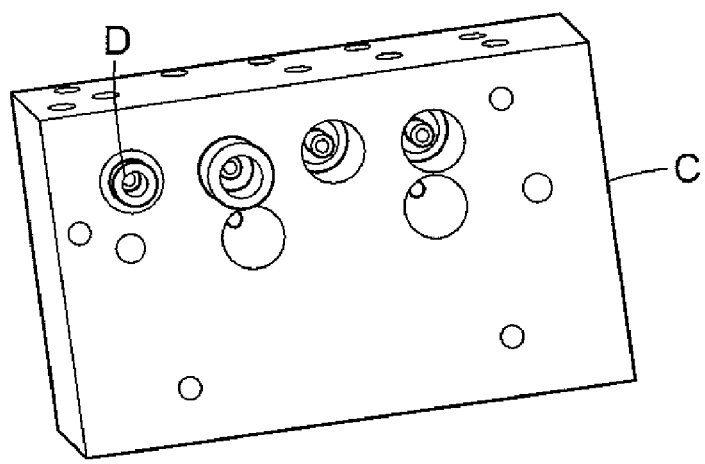
FIG. 20 shows probe points outside of the mixer block for testing the IF pin during assembly.

Prior to assembling the mixer, the various mixer blocks must be inspected, assembled and then taken apart to confirm that all the parts fit properly. The mixer blocks are then cleaned using repeated application of De-Ionized water, IPA and Acetone. The pre-tinned IF pin/Glass bead assemblies to be used in the mixer are selected and are then prepared for insertion into one of the blocks of the mixer. For each selected IF pin/Glass bead assembly, the following procedure is followed: first, the selected pre-tinned IF pin/Glass bead assembly (viz., the glass bead central conductor) is inserted into a bead centralizing jig. See FIGS. 17 and 18. That is, the central conductor if the bead is inserted into a receiving aperture in the bead centralizing jig. In this manner, the IF pin/Glass bead assembly can be manipulated without direct hand contact. Flux is applied to the outer conductor of the glass bead; the tool used to apply the flux should be replaced after each application if said tool is organic (e.g., human or animal hair), if the tool is non organic then it must be kept clean. Also it is preferable that fresh super-flux is used for each new mixer being built. Using the jig, the IF pin/Glass bead assembly is slid into an aperture of a block of the mixer assembly; said aperture is designed for receiving the IF pin/Glass bead assembly. The mixer block containing the IF pin/Glass bead assemblies is placed face down onto a glass slide. The entire block assembly and glass slide is then placed onto a hot plate set for 200° C. The solder flow at the apertures through which the IF pin/Glass beads were inserted is observed. When all of the inserted glass beads for the particular mixer block being observed have flowed, the block is removed and placed on a cooling plate. After having been cooled, the strength or adherence integrity of each of the inserted IF pin/Glass bead assemblies is tested by pushing against the IF pin portion with a dental probe. If the pin moves back through the aperture, the IF pin/Glass bead assembly needs to be re-installed in the mixer block. Possible cause of poor adhesion is contamination in either the IF pin/Class assembly component or contamination in the aperture of the mixer block. The mixer block is then cleaned by immersing in beakers of DI water, IPA and Acetone, each immersion is placed in an ultrasonic bath for 15 minutes. After the ultrasonic bath the mixer is placed in an oven at 100° C. for 15 minutes or until all liquid residue is absent. The electrical properties of the IF pin can now be tested by probing two points: one being the IF pin itself and the other being a point on the surface of the filter block (see FIG. 19 for testing within the mixer block and FIG. 20 for testing outside of the mixer block); this tests for any short between the filter pin and the mixer body. In particular, in FIG. 19, a test for electrical shorts is done between points A and B and in FIG. 20 between points C and D). The area around the IF pin filter should be inspected for any contaminants. Metallic objects are not to be used to clean the surface of the mixer block near the IF filter pin because such objects may damage any plating (e.g., gold plating) present on the surface of the mixer block. The IF filter has now been installed. The installation of the filter assembly (discussed above) including the diode will now be discussed.

A relatively small amount of UV cure epoxy is dispensed on a glass slide. With a clean probe the dispensed epoxy is applied to the area designated for the filter. The filter substrate (including the diode and filter circuitry) is placed into the filter area making sure that the filter circuitry and diode are centrally positioned into the filter area. The filter area is a grooved rectangular area or channel. When the filter is properly positioned in the filter groove, the filer is cured to the surface of the channel using a UV lamp having 200 W/cm$^2$ output with the iris open 100% for 35 seconds; an equivalent dose of UV energy may be given if a 200 W/cm$^2$ source is not available. It should be noted that the RF antenna of each filter is placed the same distance from the edge of the RF input waveguide for each channel. The process of adhering the filter/diode to the mixer block is repeated for the other filters. Is should be noted that this process can be reworked within a 24 hour period; that is, the filter can be re-adhered to the mixer block if for some reason proper adherence did not occur the first time. The proper operation of each diode and filter is confirmed after each filter is installed. Wire bonds between the filter and the IF filter pin and between the filter and pars of the mixer block are installed based on markers placed on the mixer block to enable accurate wire bonding. The wires used are 17.5 μm gold wires. For the particular wire bonding done in the mixer between the filter, IF filter pin and mixer block, a Kullicke and Soffa 4523 wedge bonder is used. Wire bonds terminating on the filter are to be placed so that the bond is formed metalwork of the filter and not the substrate of the filter. Wire bond heights (as measured from the bottom of the wire bond channel) preferably should not be greater than 150 μm. Relatively small amounts of UV epoxy are applied to areas near cavities such as the area near the IF filter pin; this is done to reduce the possibility of wire bond shorts, i.e., part of the wire bonded to the IF filter pin shorting to the mixer block surface or the area of the block surrounding the IF filter pin. A lamp with 20 W/cm$^2$ output with the iris open 100% for 35 seconds is used for curing the epoxy. The filter, diode, IF pin/Glass bead assembly have now been installed. Final assembly of the mixer blocks is now performed. However, prior to final assembly, the filter, diode, IF pin/Glass bead portions are to be carefully expected for contaminants. Also waveguide channels are to be checked for contaminants that may have fallen into such channels during rework or during original installation of the components mentioned above. The removal of contaminants must be done carefully to avoid damage to the gold plated surface of the mixer block. At least a portion of the surface of the mixer block on which the filter, diode, IF pin and Glass bead are installed is plated with gold or some other highly conductive metal or alloy. The various mixer blocks are arranged properly so that when they are slid toward each other, they engage each other to form the final mixer block. However, prior to forming the final mixer blocks, dowel pins are used to ensure proper alignment of the various blocks. Once the final mixer block is formed, screws are inserted in the holes provided and they are tightened. Spark plugs and their corresponding nylon retainers are inserted in the apertures provided. The brass output block having apertures for the antenna horns is then attached (with screws) to the final mixer block.

We claim:

1. A transceiver for receiving and/or transmitting signals, said transceiver comprising:
   a block having a received signal cavity providing a waveguide for a received signal in use, and a locally generated signal cavity providing a waveguide for a locally generated signal in use, said cavities sharing a common plane in the block;
   a mixer/filter assembly having a mixer, at least one filter and at least two mode converter portions, the mixer/filter assembly being mounted within the block, where a first mode converter portion of said mixer/filter assembly extends into the received signal cavity and a second mode converter portion of the mixer/filter assembly extends into the locally generated signal cavity, the mode converter portions of the mixer/filter assembly providing mode conversion of a received signal and the locally generated signal to a TEM mode, for propagation to the mixer, in use; and
   a filter electrically connected to the mixer/filter assembly to provide an output signal in use of the transceiver to receive signals where said filter is disposed in a further cavity of the block where said further cavity is substantially perpendicular to the common plane.

2. A transceiver as claimed in claim 1, wherein the mixer/filter assembly comprises a substrate mounted in the block, parallel to the common plane.

3. A transceiver as claimed in claim 1, wherein the received signal cavity and the locally generated signal cavity comprise physical channels in the block.

4. A transceiver as claimed in claim 1, wherein the further cavity comprises a cylindrical cavity and the electrically connected filter comprises a filter pin, sealed in a coaxial position in the further cavity.

5. A transceiver as claimed in claim 4, wherein the filter pin is sealed in the further cavity by means of UV-cured glass.

6. A transceiver according to claim 1 for receiving and/or transmitting radio frequency signals, wherein, in use, said received signal cavity guides a radio frequency signal, and the filter disposed in the further cavity extracts an intermediate frequency signal generated by the mixer/filter assembly.

7. A transceiver according to claim 1 for use in receiving and/or transmitting signals having wavelengths of one millimeter or less.

8. A transceiver according to claim 1, said block further having a horn antenna cavity providing at least part of a horn antenna for receiving and/or transmitting signals in use of the transceiver, the horn antenna cavity being coupled to the received signal cavity and sharing the common plane.

9. A transceiver according to claim 8, comprising multiple sets of received signal, locally generated signal and horn antenna cavities sharing said common plane, each set having an electrically connected filter to provide an output signal in use of the transceiver to receive signals, the electrically connected filter being disposed in a further cavity substantially perpendicular to the common plane.

10. A transceiver according to claim 1, wherein the mode converter portions of the mixer/filter assembly comprise antennas.

11. A transceiver according to claim 1, wherein the mixer/filter assembly comprises diodes in an anti-parallel configuration for use in mixing a received signal with a locally generated signal.

12. A transceiver according to claim 11, wherein the mixer/filter assembly comprises a pair of diodes in an anti-parallel configuration.

13. A transceiver according to claim 1, wherein the mixer/filter assembly comprises one or more tuners for use in delivering the received signal and the locally generated signal to the mixer for mixing.

14. A transceiver according to claim 13, wherein at least one of said one or more tuners is connected to the first mode converter portion of said mixer/filter assembly, having a minimized mismatch therewith and being adapted to optimize the match of the locally generated signal to the mixer, in use of the transceiver.

15. A transceiver according to claim 13, wherein at least two of said one or more tuners comprise transmission lines connected between the mixer/filter assembly and the block to make a physical ground and hence reactive termination to reflect the received signal and the locally generated signal.

16. A transceiver according to claim 15, wherein the lengths of the at least two tuners connected between the mixer/filter assembly and the block are tuned for coupling the received signal to the mixer, in use of the transceiver.

17. A transceiver according to claim 1, wherein the filter which provides an output signal in use of the transceiver is connected to the mixer/filter assembly by means of bond wires.

18. A transceiver according to claim 11, wherein the locally generated signal has a frequency, in use of the transceiver, at which the received signal cavity provides a purely reactive termination.

19. A transceiver according to claim 6, wherein the intermediate frequency signal is substantially lower in frequency than the received signal or the locally generated signal such that the locally generated signal cavity acts as a high pass filter blocking the intermediate frequency signal.

20. A transceiver according to claim 4, wherein the dimensions of the filter pin sealed in its coaxial position in the further cavity are optimized with respect to rejection of the locally generated signal and insertion loss to the output signal in use of the transceiver.

21. A transceiver according to claim 1 for use in receiving and/or transmitting signals having wavelengths of more than one millimeter.

* * * * *